(12) United States Patent
Amemiya

(10) Patent No.: US 7,633,598 B2
(45) Date of Patent: Dec. 15, 2009

(54) FILTER EXPOSURE APPARATUS, AND DEVICE MANUFACTURING METHOD

(75) Inventor: Mitsuaki Amemiya, Saitama (JP)

(73) Assignee: Canon Kabushiki Kaisha (JP)

(*) Notice: Subject to any disclaimer, the term of this patent is extended or adjusted under 35 U.S.C. 154(b) by 341 days.

(21) Appl. No.: 11/456,673

(22) Filed: Jul. 11, 2006

(65) Prior Publication Data

US 2007/0015067 A1 Jan. 18, 2007

(30) Foreign Application Priority Data

Jul. 12, 2005 (JP) ............................. 2005-203544

(51) Int. Cl.
G03B 27/42 (2006.01)
(52) U.S. Cl. .......................................... 355/53; 430/5
(58) Field of Classification Search ................. 355/53, 355/30, 67; 430/5; 250/492.1, 493.1, 251
See application file for complete search history.

(56) References Cited

U.S. PATENT DOCUMENTS

| 6,522,465 | B1 | 2/2003 | Goldstein |
| 2004/0061930 | A1 | 4/2004 | Wedowski |
| 2006/0160031 | A1* | 7/2006 | Wurm et al. ................. 430/322 |

FOREIGN PATENT DOCUMENTS

| JP | 2000-89000 | 3/2000 |
| JP | 2004103773 A * | 4/2004 |

OTHER PUBLICATIONS

English translation of the Patent Publication of 2004103773 (Kondo Hiroyuki) is attached.*

Booth, et al, High-resolution EUV imaging tools for resist exposure and aerial image monitoring<Proceedings of SPIE, vol. 5751, May 2005, pp. 78-89.

Extended European Search Report issued in corresponding European Patent Application No. 06116973.6 dated Jul. 20, 2009.

Booth, M. et al., "High-resolution EUV imaging tools for resist exposure and aerial image monitoring", Proceedings of the SPIE, vol. 5751, No. 1, Mar. 3, 2005, pp. 97-108. Cited in EESR issued in corres. EP 06116973.6 dated Jul. 20, 2009; see NPL cite No. 1.

Powell, Forbes R. et al., "Filter windows for EUV lithography", Proceedings of the SPIE, vol. 4343, Jan. 1, 2001, pp. 585-589. Cited in EESR issued in corres. EP 06116973.6 dated Jul. 20, 2009; see NPL cite No. 1.

* cited by examiner

Primary Examiner—Alan A Mathews
Assistant Examiner—Mesfin T Asfaw
(74) Attorney, Agent, or Firm—Rossi, Kimms & McDowell, LLP

(57) ABSTRACT

A filter used for an exposure apparatus that exposes a plate using a light from a light source includes a light transmitting film configured to transmit the light from the light source, a first rod member that includes plural first rod members, and thermally contacts the light transmitting film, the plural second rod members being rod members and including a second rod member; and a second member that includes plural second rod members, and thermally contacts the light transmitting film and/or the first member, the plural second rod members being other rod members including a second rod member, wherein a heating value transmittable by the first rod member per unit time in a longitudinal direction of the first rod member is smaller than a heating value transmittable by the second rod member per unit time in a longitudinal direction of the second rod member.

12 Claims, 15 Drawing Sheets

FILTER EXPOSURE APPARATUS, AND DEVICE MANUFACTURING METHOD

BACKGROUND OF THE INVENTION

The present invention relates generally to a filter, and more particularly to a filter used for an exposure apparatus that utilizes an extreme ultraviolet ("EUV") light emitted from a pulsed light source.

A conventional reduction projection exposure apparatus uses a projection optical system to project a circuit pattern of a mask (or a reticle) onto a wafer, etc. to transfer the circuit pattern, in manufacturing such a fine semiconductor device as a semiconductor memory and a logic circuit in the photolithography technology.

The minimum critical dimension ("CD") to be transferred by the reduction projection exposure apparatus or resolution is proportional to a wavelength of the light used for the exposure, and inversely proportional to the numerical aperture ("NA") of the projection optical system. The shorter the wavelength is, the finer the resolution becomes. Along with the recent demands for the finer semiconductor devices, use of a shorter wavelength of ultraviolet ("UV") light has been promoted from an ultra-high pressure mercury lamp (i-line with a wavelength of approximately 365 nm) to a KrF excimer laser (with a wavelength of approximately 248 nm) and an ArF excimer laser (with a wavelength of approximately 193 nm).

However, the lithography using the UV light cannot catch up with the rapid advancement of the fine processing of a semiconductor device, and a reduction projection optical system using the EUV light with a wavelength of 10 to 15 nm shorter than that of the UV light (referred to as an "EUV exposure apparatus" hereinafter) has been developed to efficiently transfer a very fine circuit pattern of 0.1 µm or less.

The EUV light source typically uses a laser produced plasma ("LPP") light source and a discharge produced plasma ("DPP") light source. The LPP light source irradiates a laser light to the target material, generates plasma and the EUV light. The DPP light source circulates a gas around the electrode, discharges it, and generates plasma and the EUV light. Both light sources supply a gas, such as Argon (Ar) and Helium (He), near a plasma generating point, and prevents the high-energy plasma from damaging the optical element, such as a condenser mirror. The degree of vacuum in a light source chamber that accommodates the plasma is maintained at about $1 \times 10^{-1}$ Pa.

On the other hand, an illumination optical system chamber that accommodates multilayer mirrors of an illumination optical system should be maintained at the degree of vacuum of $1 \times 10^{-5}$ Pa or smaller. This is because any contaminant adheres in a membranous state to the multilayer mirror in the illumination optical system chamber, onto which the EUV light is irradiated. The contaminant adhered multilayer mirror shifts a phase of the EUV light reflected on the contaminated spot, remarkably deteriorating the imaging performance.

Due to a four-digit pressure difference between the light source chamber and the illumination optical system chamber, they cannot be connected as they are. Accordingly, use of differential pumping and a thin film are proposed to connect the light source chamber to the illumination optical system chamber. See, for example, Japanese Patent Application, Publication No. 2000-89000 and Proc. SPIE Vol. 5751, pp. 78-89 (May 2006). The differential pumping method connects these chambers via a small opening between them, and exhausts both chambers with a cylinder-capacity vacuum pump, thereby creating a differential pressure. A method that uses a thin film vacuum-separates the light source chamber from the illumination optical system chamber, and has been conventionally used in the synchrotron radiation pilot plants.

Nevertheless, these methods that use the conventional differential pumping and thin film are not directly applicable to the EUV exposure apparatus. For example, the differential pumping method cannot make the opening enough small that connects the light source chamber to the illumination optical system chamber because the opening is used to allow the EUV light to pass it, and thus cannot create a large pressure difference.

On the other hand, the EUV light intensity is so high that the thin film is not endurable in the thin film method. For example, the EUV exposure apparatus requires about 120 W for the EUV light intensity for the exposure wavelength (referred to as "in-band"). It is said that the overall intensity of the wave range that contains wavelengths other than the in-band is five to ten times as high as the in-band intensity. When the light has a diameter of 10 mm at the intermediate condensing point, the light intensity is 800 to 3,000 W/cm$^2$ at the intermediate condensing point.

The EUV light is such a low transmittance to materials that the thin film should be thinner than 1 µm. For example, a 0.2-µm thick thin film made of zirconium (Zr) that has the highest transmittance to the exposure wavelength of 13.5 nm can transmit only 50% of the EUV light. The EUV light having the wavelength of 13.5 nm is seldom reflected on the thin film. Therefore, when the high-intensity EUV light enters the thin film, the thin film absorbs 50% of the incident energy, and the temperature rises. When the energy of 20 W/cm$^2$ is incident upon a Zr thin film having a thickness of 0.2 µm and a diameter of 10 mm, and the film absorbs 50% of the energy, the maximum temperature becomes 1,800 K even when the heat radiation is considered. Although this temperature does exceed the Zr's melting point, the Zr evaporation speed is about $2 \times 10^{-3}$ µm/hr, and the 0.2-µm thick Zr film rapidly thins and cannot maintain the vacuum diaphragm function. Thus, when the thin film requires a small incident intensity of the EUV light but this intensity is insufficient to the exposure and the thin film cannot used in reality.

In addition, a self-sustainment such a thin film as 1 µm or thinner is very difficult in a large area. The 0.2-µm thick film can be self-sustained only in a size of about 1 mm or smaller. One known method of supporting the thin film is a method of forming a thin film on a mesh structure. For example, a transmission electron microscope ("TEM") irradiates an electron beam onto a sample on an organic film that transmits the electron beam. Since the organic film is so thin as 0.01 µm to 0.1 µm, the self-sustainment of the organic film is difficult and the mesh structure is used to support the organic film. The synchrotron radiation experimental device uses a metallic thin film supported by the mesh structure. The irradiation intensity can be considered time-wise uniform in both the TEM and the synchrotron radiation experimental device. The synchrotron radiation is a repetition of pulses. However, a ratio between the pulse's time width and period is not so large and the frequency is so high as 1 GHz to 1 MHz, and thus the synchrotron radiation can be regarded as the continuum. On the other hand, the plasma light source has a lower repetitive frequency, e.g., about 10 kHz, than the synchrotron radiation, and such a large pulsed width as 10 to 50 nsec, and cannot be regarded as a continuum.

BRIEF SUMMARY OF THE INVENTION

A filter according to one aspect of the present invention used for an exposure apparatus that exposes a plate using a light from a light source includes a light transmitting film configured to transmit the light from the light source, a first member that includes plural first rod members, and thermally contacts the light transmitting film, the plural first rod members being rod members and including a first rod member; and a second member that includes plural second rod members, and thermally contacts the light transmitting film and/or the first member, the plural second rod members being other rod members including a second rod member, wherein a heating value transmittable by the first rod member per unit time in a longitudinal direction of the first rod member is different from a heating value transmittable by the second rod member per unit time in a longitudinal direction of the second rod member.

A filter according to another aspect of the present invention used for an exposure apparatus that exposes a plate using a light from a light source includes a light transmitting film that has a first thickness, and is configured to transmit the light from the light source, a first heat conductive member that has a second thickness different from the first thickness, and thermally contacts the light transmitting film, and a second heat conductive member that has a third thickness different from the second thickness, and thermally contacts the light transmitting film and/or the first heat conductive member.

An exposure apparatus according to one aspect of the present invention for exposing a mask pattern onto a plate using a light from a light source includes the above filter that is arranged in an optical path between the light source and the plate.

A device manufacturing method according to another aspect of the present invention includes the steps of exposing a plate to be exposed using the above exposure apparatus, and developing the plate exposed.

A light source unit according to another aspect of the present invention for emitting a pulsed light includes the above filter.

Other objects and further features of the present invention will become readily apparent from the following description of the preferred embodiments with reference to accompanying drawings.

DETAILED DESCRIPTION OF THE PREFERRED EMBODIMENTS

Figure 1:
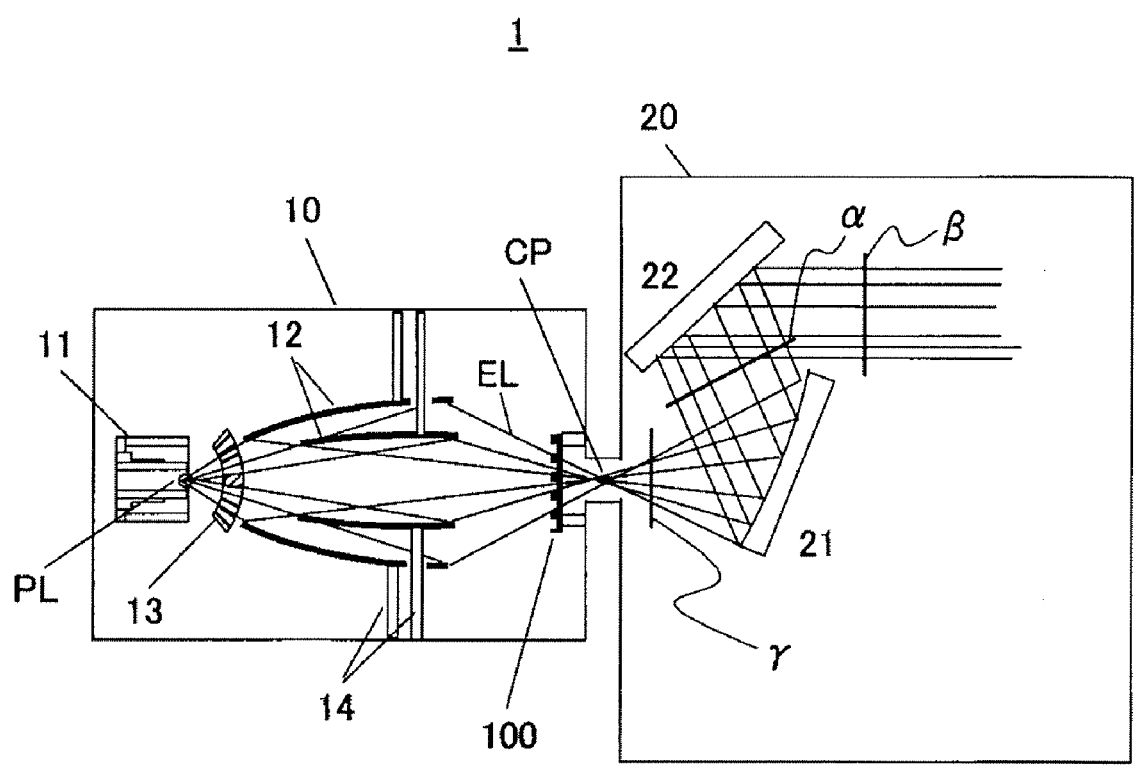
FIG. 1 is a schematic sectional view showing a structure of a light source unit according to one aspect of the present invention.

Referring now to the accompanying drawings, a description will be given of a filter according to one aspect of the present invention. Like elements are designated by the same reference numerals in each figure, and a duplicate description will be omitted.

A description will be now given of a temperature rise of the filter that is used for the EUV exposure apparatus and includes a mesh structured member, and a light transmitting film that transmits the EUV light (having a wavelength between 10 nm and 20 nm, preferably between 13 nm and 15 nm). The mesh structure, as used herein, means a structure in which plural first rod members intersect at plural nodes. Each section defined by the plural first rod members may have any shape, such as a square, a rectangle, a triangle, a polygon, and a shape having a curved line, e.g., a circle and an ellipse. The light transmitting film may have a transmittance of 50% or greater at a thickness of 0.01 µm (preferably 65% or greater, more preferably 70% or greater, therefore does not have to possess a transmittance of 100%). The instant inventor has found that when a (pulsed) light is irradiated from a pulsed light source, such as a plasma light source, which has an emission period shorter than the emission time period, a temperature rises differently between the mesh structured first rod member ("meshed member") and the light transmitting film. The mesh structure has plural first rod members.

More specifically, when the pulsed light source starts emissions, a temperature of the meshed rod member gradually rises and finally reaches a certain temperature. On the other hand, the temperature of the light transmitting film before receiving the EUV light approximately accords with the temperature of the meshed member. In response to the incident pulsed EUV light, the temperature rises for 10 [nsec] during which the EUV light is incoming. The temperature of the light transmitting film falls for the standby period to the next emission, and the temperature rises again when the EUV light is again incident.

Thus, the temperature of the light transmitting film fluctuates at a predetermined amplitude around the temperature of the meshed rod member, and the predetermined period is equal to the emission frequency of the light source. A description will be given of a detailed review of this temperature rise, and a condition of the filter usable for the EUV exposure apparatus that uses the plasma light source.

Further to a description of a specific embodiment of the present invention, a description will be given of a temperature change of the light transmitting film (thin film) caused by the incident periodic pulsed light.

Assume that the pulsed light source emits the EUV light with a pulsed width of 50 [nsec], a period of 1 [kHz], and an intensity of 20 [W/cm$^2$] per time average. A description will be given of a temperature change of a filter that includes a Zr light transmitting film, and a meshed rod member that supports the light transmitting film, when the above EUV light enters the filter.

The temperature of the meshed rod member gradually rises with time, but may be considered constant in a time period several times as long as the pulse emission interval. The Zr light transmitting film having a thickness of 0.2 [μm] has a diameter of 0.5 [mm]. The film is attached to the mesh structure at the periphery, and it is assumed that the temperature does not change. Since the Zr light transmitting film having a thickness of 0.2 [μm] absorbs 50% of the EUV light having a wavelength of 13.5 nm, the EUV light having an intensity of 10 [W/cm$^2$] per time average. In the emission time period of 50 [nsec], the intensity of the EUV light absorbed in the Zr light transmitting film is 2×10$^5$ [W/cm$^2$].

Figure 7:
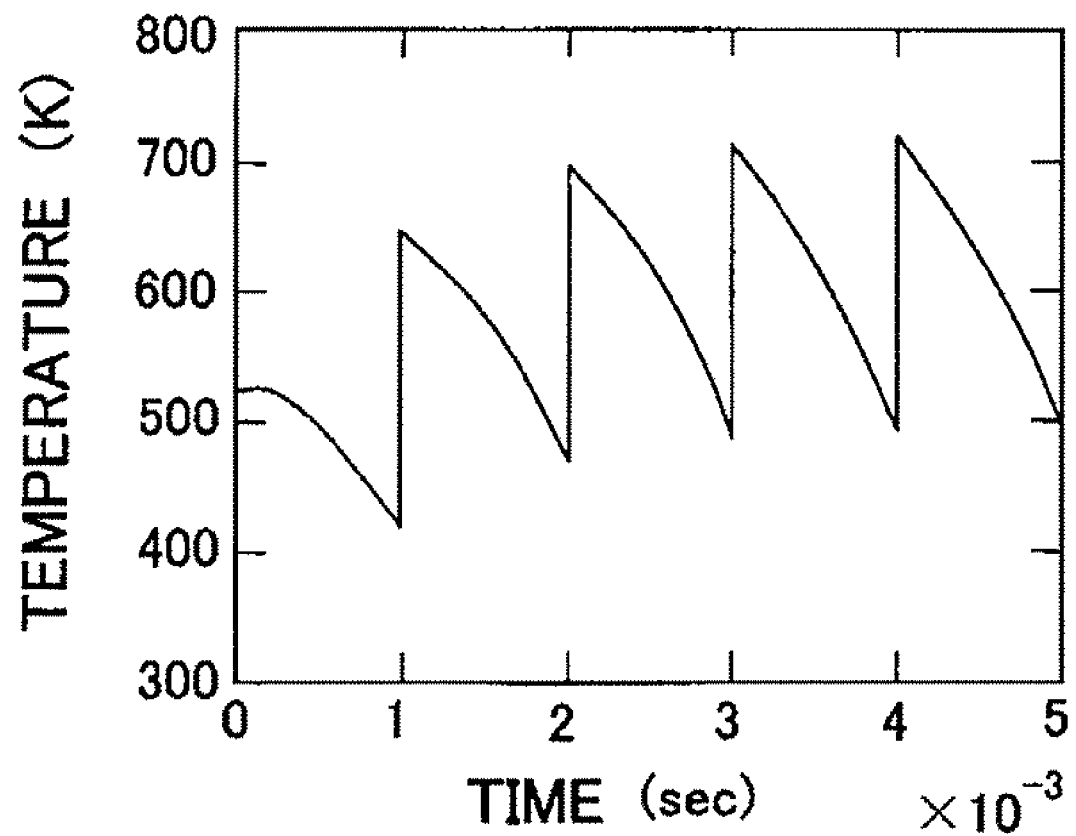
FIG. 7 is a graph showing a temperature change of a Zr light transmitting film receiving the pulsed light (or EUV light).

FIG. 7 shows a temperature change of the Zr light transmitting film caused by the pulsed light (or the EUV light), where an abscissa axis denotes time, and an ordinate axis denotes a temperature of the center of the light transmitting film. Referring to FIG. 7, the light transmitting film has an initial temperature of 300 [K], the temperature rises up to 520 [K] due to the initial irradiation of the EUV light, and the temperature falls down to 430 [K] until the next EUV light is irradiated. The light transmitting film has a temperature of 650 [K] due to the next irradiation of the EUV light. As a result of repetitions, the light transmitting film saturates at the maximum temperature of 700 [K].

Equation 1 below gives an incident energy Ei of the EUV light during the pulse emission, an energy Er that releases due to the radiation, and an energy Et that releases due to the thermal conduction, where S is an area of the Zr light transmitting film, r is a radius of 0.25×10$^{-3}$ [m], th is a thickness of 0.2 [μm], λ is a heat conductivity, σ is a Stephan-Boltzmann's constant, ε is an emissivity or radiation index, T is a temperature of the Zr light transmitting film of 700 [K], and To is a room temperature of 300 [K]:

$$Ei=2\times10^9\times S=392 [W]$$

$$Er=\sigma\times(T^4-T_0^4)\times\epsilon\times S=2.6\times10^{-3}\times\epsilon=2.6\times10^{-4} [W]$$

$$Et=(T-T_0)/r\times(th\times r)\times\lambda=1.8\times10^{-3} [W] \quad \text{[EQUATION 1]}$$

Since Equation 2 below is established, the heat discharge amount does not have to be considered during an emission of the EUV light (pulsed light). A temperature rise ΔTp of the Zr light transmitting film per one pulse is expressed by Equation 3 below where (Cp×ρ×th) is a heat capacity per unit area of the Zr light transmitting film, I [W/m$^2$] is an incident intensity of the EUV light during the emission, and tp is a pulse width:

$$Ei \gg Er+Et \quad \text{[EQUATION 2]}$$

$$\Delta tp \approx I\times tp/(Cp\times\rho\times th) \quad \text{[EQUATION 3]}$$

Next follows a temperature drop of the light transmitting film between pulses of the EUV light. Assume a heat conduction equation of the thin disc shaped, Zr light transmitting film that is sectioned by a mesh structure and the temperature is restrained around its perimeter. Equation 4 below expresses a heat conduction equation of a thin Zr disc in which the temperature is restrained around its perimeter (at a temperature T0), where ΔT (=T−T0) is a temperature difference from the perimeter, r is a position from the center, and q0 is an energy absorbed in the Zr light transmitting film per unit area and unit time:

$$Cp\times\rho\times\partial\Delta T/\partial t=\lambda\times\partial^2\Delta T/\partial r^2+\lambda/r\times\partial\Delta T/\partial r+q0/th-\sigma\times\epsilon\times(T^4-T_0^4) \quad \text{[EQUATION 4]}$$

The right fourth term in Equation 4 is a heat value that releases by the radiation. However, as discussed above, the heat value that releases by the radiation is smaller than that by the thermal conduction. Thus, when Equation 4 is modified to have a term that releases by the thermal conduction, and q0 is made 0 because the emission of the EUV light stops. Where A$^2$ is Cp×ρ/λ, Equation 4 turns into Equation 5 below:

$$\partial\Delta T/\partial t=\partial^2\Delta T/\partial(Ar)^2+1/(Ar)\times\partial\Delta T/\partial(Ar) \quad \text{[EQUATION 5]}$$

Equation 5 is a function of r×√(Cp×ρ/λ). This equation means that the temperature change of the light transmitting film is the same when the initial temperature as a temperature distribution of the Zr light transmitting film is the same just after the emission of the EUV light stops, and if (Cp×ρ/λ) becomes one-fourth times even when the disc's diameter becomes double.

A description will now be given of the maximum temperature of the light transmitting film when the EUV light (or pulsed light) has such a short emission period that the next EUV light is continuously incoming and causes the temperature of the light transmitting film to rise before the temperature of the Zr light transmitting film finishes dropping. As the size reduces of the section defined by the mesh structure (which section is one area enclosed by the first rod member formed by the mesh structure in the light transmitting film), the heat release becomes fast enough to handle the EUV light that emits at a high speed. Accordingly, the frequency of the incident EUV light and the size of the section defined by the mesh structure are defined.

Referring to FIG. 7, assume that the center temperature of the Zr light transmitting film rises from the initial temperature T0 from the first EUV light incidence due to the first incidence of the EUV light, and a temperature difference from the periphery becomes a maximum temperature difference ΔTm (1). Assume that the temperature of the light transmitting film thereafter drops, and the second incidence of the EUV light occurs with the maximum temperature difference ΔTm(2). Since the temperature rise value ΔTp caused by the first incidence of the EUV light is constant as shown in Equation 3, the maximum temperature difference Tm(2) is expressed by Equation 6 below:

$$\Delta Tm(2)=\Delta Ti(2)+\Delta Tp=\Delta Tm(1)\times\Delta Ti(2)/\Delta Tm(1)+\Delta Tp \quad \text{[EQUATION 6]}$$

Where R is ΔTi (2)/ΔTm(1), it indicates a ratio of the temperature drop of the light transmitting film until the next EUV light is incident. Therefore, the maximum temperature difference ΔTm(n) when the n-th incidence of the EUV light occurs is expressed by Equation 7 below with a temperature difference ΔTi (n) and R just before the n-th incidence of the EUV light occurs:

$$\Delta Tm(n)=\Delta Ti(n)+\Delta Tp=\Delta Tm(n-1)\times R+\Delta Tp \quad \text{[EQUATION 7]}$$

When the number of emissions of the EUV light is made infinite (or n→∞) in Equation 7, Equation 8 below is obtained:

$$\Delta Tm(\infty)=\Delta Tp/(1-R) \quad \text{[EQUATION 8]}$$

Since ΔTp has been known from Equation 3, the maximum temperature difference ΔTm(∞) can be calculated once a relationship between a damping factor R and a frequency is known.

Figure 8:
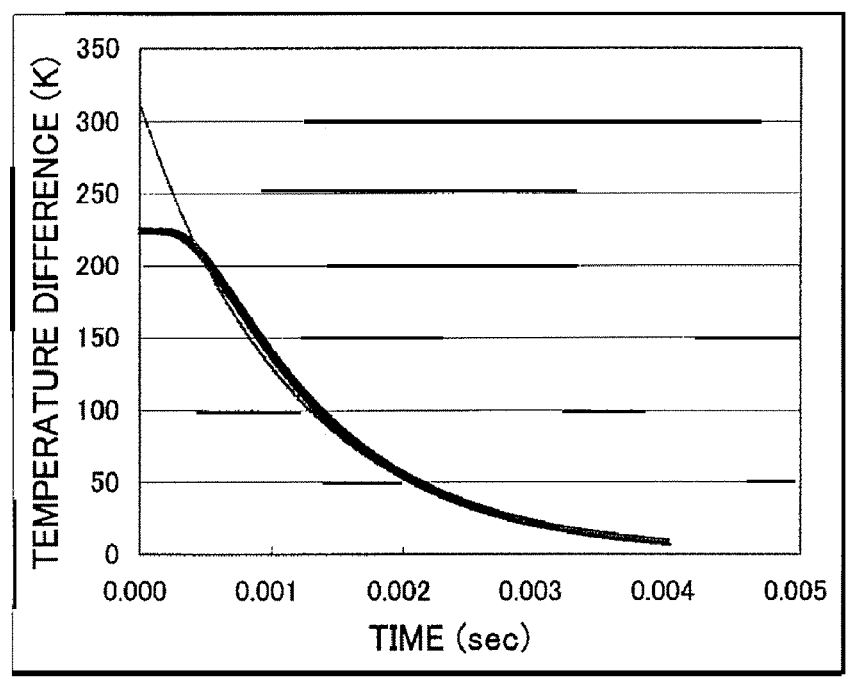
FIG. 8 is a graph showing a temperature of the center of the light transmitting film when the film initially receives the EUV light.

FIG. 8 shows the center temperature of the light transmitting film upon which the EUV light is incident first time. FIG. 8 corresponds to a temperature rise with the first incidence of the EUV light in FIG. 7. In FIG. 8, a thick line is a calculated value, and a thin line is an exponent approximated curve. Referring to FIG. 8, the temperature shown by the thick line does not change about 0.2 [msec] just after the EUV light is incident. This is because just after the EUV light is incident, the entire light transmitting film has a uniform temperature, and the temperature drops from the periphery and it takes time that the temperature drops near the center of the light transmitting film. As understood from FIG. 7, in the second and subsequent incidences of the EUV light, the initial temperature of the light transmitting film distributes and this phenomenon does not appear. In the second and subsequent incidences of the EUV light, it approaches to the approximate curve of the temperature change. The relaxation time of this approximate curve is 1.1 [msec]. If it is assumed that the permissible value of the temperature difference is five times as large as the maximum temperature rise ΔTp due to the first incidence of the EUV light, the damping factor becomes 0.2 from Equation 8. Moreover, the next incidence of the EUV light is determined at time 0.25 [msec] from the damping factor of 1.1 [msec] of the approximate curve shown in FIG. 8.

Figure 9:
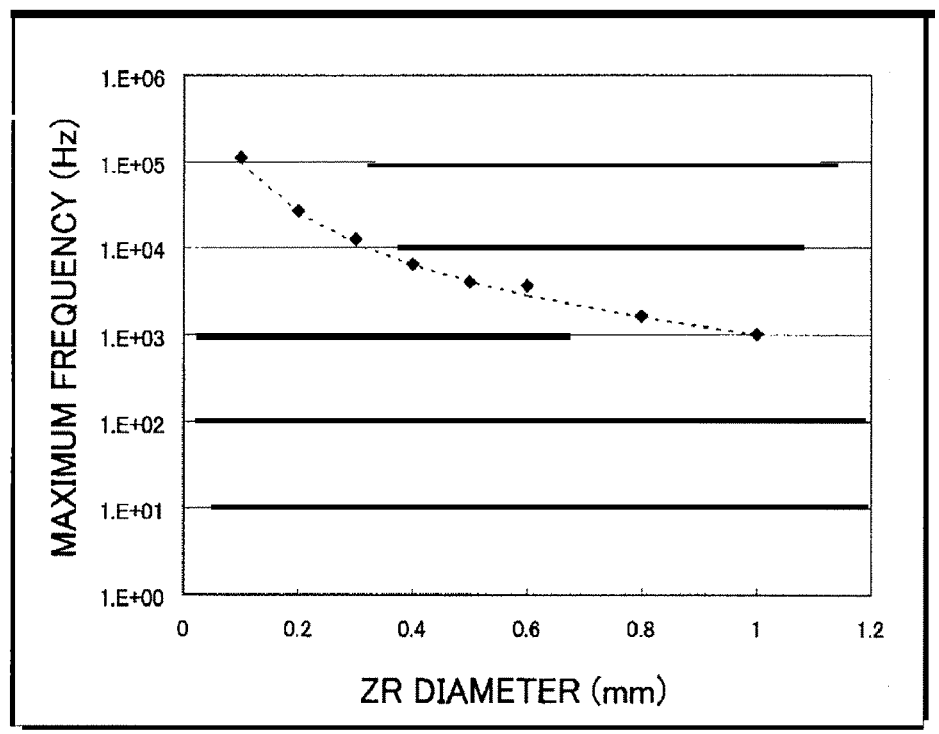
FIG. 9 is a graph showing a maximum frequency of the EUV light to a diameter of the light transmitting film.

Therefore, the maximum frequency of the EUV light relative to the light transmitting film having a diameter of $0.5 \times 10^{-3}$ [m] becomes 4 [kHz] or smaller. Similarly, FIG. 9 shows the calculated maximum frequency of the EUV light obtained for each diameter of the light transmitting film. In FIG. 9, a dot is the maximum frequency of the EUV light for each diameter of the light transmitting film. A broken line is an approximation of each dot, and it is expressed by Equation 9 below, where F [Hz] is the maximum frequency, and s [m] is a diameter of one section of the light transmitting film (or a section defined by the mesh structure):

$$F = 1/(1000 \times s^2) \quad \text{[EQUATION 9]}$$

Equation 9 is established irrespective of a thickness of the Zr light transmitting film from Equation 5. Equation 9 means that when Zr light transmitting film is used, the section defined by the mesh structure should be smaller than Equation 9 for the light source having a frequency F [Hz]. In other words, the diameter s of one section in the light transmitting film should satisfy Equation 10 below, where F [Hz] is a frequency of the EUV light:

$$s < 1/\sqrt{(1000 \times F)} \quad \text{[EQUATION 10]}$$

Figure 10:
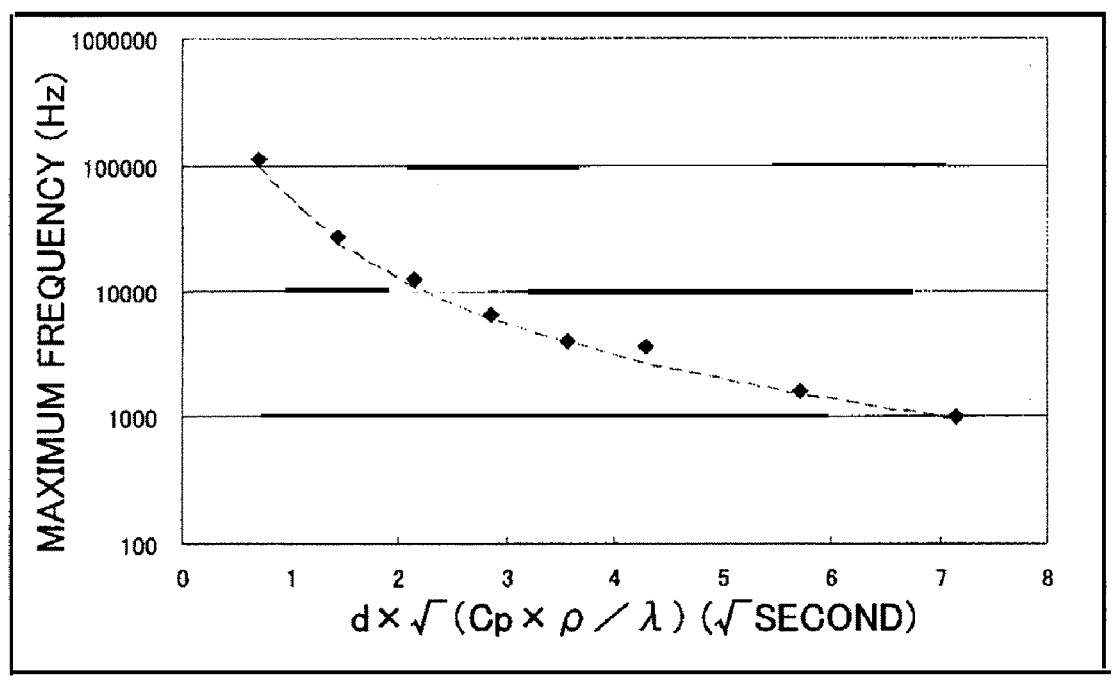
FIG. 10 is a graph showing a relationship between a shape of the light transmitting film and an emission frequency of the EUV light.

Zr is a good material for a transmitting film to the EUV light when the transmittance and the heat resistance are considered, but Zr is inferior to other materials, such as Mo, in evaporation rate and thermal conductivity. When the light transmitting film uses a composite film that is formed by evaporating Mo etc. on the Zr surface, defects of the evaporation rate and the thermal conductivity can be rectified. In that case, as shown in Equations 4 and 5, the maximum diameter s of one section in the light transmitting film may be calculated from Equation 5 by using $(C_p \times \rho \times r/\lambda)$ as a variable. FIG. 10 is a graph in which an abscissa axis denotes $s \times \sqrt{/(C_p \times \rho/\lambda)}$, and an ordinate axis denotes a maximum frequency. In FIG. 10, a dot is a maximum frequency calculated for $s \times \sqrt{/(C_p \times \rho/\lambda)}$, and a broken line is its approximated equation expressed by Equation 11 below, where $C_p$ is a thermal capacity [J/kg/K] of the light transmitting film, ρ is a density of the light transmitting film [kg/m$^3$], s is a diameter [m] of one section in the light transmitting film, and λ is a thermal conductivity [W/m/K] of the light transmitting film:

$$F = 5 \times 10^4 / (C_p \times \rho/\lambda \times s^2) \quad \text{[EQUATION 11]}$$

From Equation 11, the maximum diameter s [m] of one section in the light transmitting film should satisfy Equation 12 below:

$$s < \sqrt{(5 \times 10^4)} / \sqrt{(F \times C_p \times \rho/\lambda)} \quad \text{[EQUATION 12]}$$

In introducing Equation 10 or 12, the permissible value of the temperature difference from the meshed member is set to five times as large as the temperature rise ΔTp caused by one incidence of the EUV light. This is suitable when ΔTp is small since the emission frequency of the EUV light is relatively high and single incidence energy is low. For example, when the frequency of the EUV light is 10 [kHz] and the average intensity is 10 [W/cm$^2$], the temperature rise ΔTp is 22 [K] in the 0.2-μm thick Zr light transmitting film due to the single incidence of light, and the maximum temperature difference becomes 110 [K]. However, the emission frequency of the EUV light is relatively small and the single incidence energy is high, the maximum temperature difference should be made small. For example, in irradiating the EUV light having the emission frequency of 4 [kHz] and the same intensity, ΔTp becomes 55 [K]. Therefore, in order to make the maximum temperature difference between the first rod member or the meshed member and the light transmitting film equal to the temperature difference when the light source has an emission frequency of 10 [kHz], the maximum temperature difference may be made twice as large as the maximum temperature difference ΔTp. In that case, the damping factor R becomes 0.5 from Equation 8, and an equation corresponding to Equation 10 is expressed by Equation 13 below. An equation corresponding to Equation 12 is expressed by Equation 14 below:

$$s < 1/\sqrt{(3000 \times F)} \quad \text{[EQUATION 13]}$$

$$s < \sqrt{(2 \times 10^4)} / \sqrt{(F \times C_p \times \rho/\lambda)} \quad \text{[EQUATION 14]}$$

The section defined by the mesh structure (or one section in the light transmitting film) has been thus calculated and described. However, the shape of the section defined by the actual mesh structure is a repetitive shape of a rectangle, a hexagon, etc. In that case, since the minimum value dominates the heat release, a size s [m] in Equations 11 to 14 is a diameter of the least circle that contacts at least three sides of one section defined by the mesh structure.

Next follows a description of the least size of the section defined by the mesh structure (or one section in the light transmitting film). The mesh structure includes plural first rod members, as described above. The maximum temperature rise is given by w/p, where w is a width [m] of the first rod member and p is a pitch [m] of the first rod members in the mesh structure. Therefore, when the first rod member's width W is made small, the first rod member's pitch p can be made arbitrarily small.

However, the incident EUV light is not parallel light, and the first rod member in the mesh structure has a thickness and a shadow of the first rod member is generated. Since the first rod member's shadow decreases the substantial transmittance, the pitch p of the first rod member cannot be made small infinitely. The shadow length l of one first rod member is expressed by $l = th \times \tan \theta$, where θ is an incident angle of the EUV light, and th is a thickness of the first rod member. In general, the incident light is incident as a conical shape having a center of the optical axis, and the incident angle θ is not constant and differs according to positions. The average length lav of the first rod member's shadow is expressed by Equation 15 below, and the substantial numerical aperture K is consequently expressed by Equation 16 below:

$$lav = 2th \int [\theta 2, \theta 1] (\sin \theta)^2 \times (\cos \theta)^{-4} d\theta / ((\tan \theta 2)^2 - (\tan \theta 1)^2)$$ [EQUATION 15]

$$K = (s - lav)^2 / s^2 \approx 1 (lav/s)^2$$ [EQUATION 16]

An emission intensity distribution of a used light source is expressed by Equation 17 below for a general NA of 0.1 to 0.25:

$$K = 1 - 0.036 \times (th/s)^2$$ [EQUATION 17]

Therefore, when the numerical aperture K is 60%, the minimum size s of the section defined by the mesh structure (or one section of the light transmitting film) is expressed by Equation 18 below:

$$s > 0.3 \times th$$ [EQUATION 18]

When the first rod member has a thickness of 100 [μm], the size s of the section defined by the mesh structure is 30 [μm] or greater.

Figure 11:
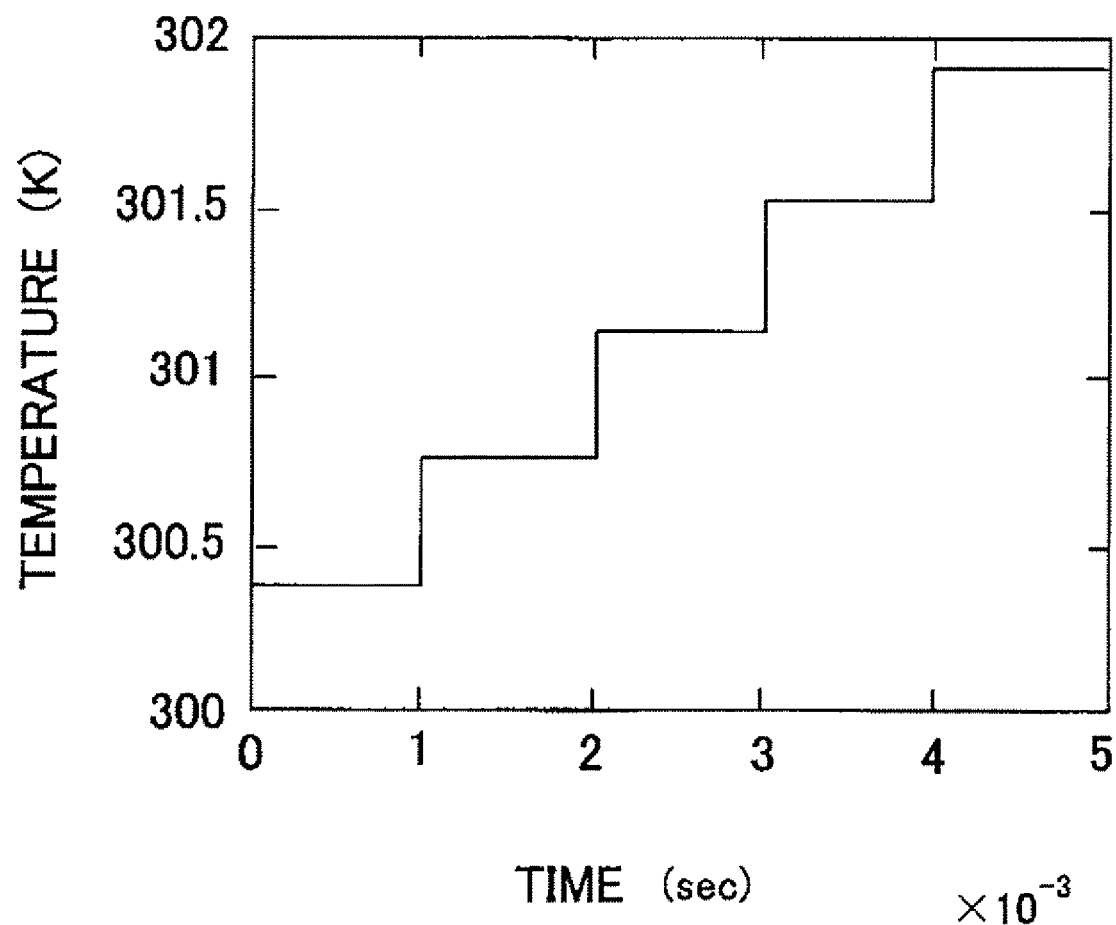
FIG. 11 is a graph showing a temperature rise value of a Mo mesh structure receiving the EUV light (or pulsed light).

Next follows a description of a temperature rise of the meshed first rod member caused by an irradiation of the EUV light (or pulsed light). FIG. 11 is a graph showing a temperature rise value of the Mo mesh structure caused by the irradiation of the EUV light (or pulsed light). In FIG. 11, an abscissa axis denotes the time, and an ordinate axis denotes a central temperature of the mesh structure. In the calculation condition, the thickness of the mesh structure is 100 [μm] and the outer diameter is 20 [mm]. Other conditions are similar to those for the above Zr light transmitting film.

Referring to FIG. 11, the temperature of the mesh structure rises by about 0.4 [K] when receiving the EUV light. It is understood that the temperature hardly drops until the next incidence of the EUV light, and the temperature rise value of 0.4 [K] is added whenever the EUV light is incident. Therefore, the incident light may be regarded as the time average intensity. The temperature change of the mesh structure is significantly different from the light transmitting film, because the first rod member in the mesh structure is much thicker than the light transmitting film, and has a larger thermal capacity, whereby it takes time for the heat to release.

The temperature of the mesh structure is not a temperature change for each pulse, and may be calculated by disregarding the EUV light is a pulsed light and by treating the EUV light as if it has a constant intensity time-wise. In particular, the maximum temperature in the equilibrium is important, and the maximum temperature is calculated. The heat conduction equation of temperature of the thin disc in the equilibrium is expressed by Equation 19 below by setting a left side in Equation 4 to 0:

$$0 = \lambda \times \partial^2 \Delta T / \partial r^2 + \lambda / r \times \partial \Delta T / \partial r + q0/th - \sigma \times \epsilon \times (T^4 - T_0^4)$$ [EQUATION 19]

Assume the condition in which the outer diameter of the mesh structure is sufficiently larger than the size of one section in the Zr light transmitting film defined by the mesh structure, the entire mesh structure has a size between 10 and 50 [mm], the mesh structure has sufficiently many gratings. It is understood that for a square mesh structure formed by plural first rod members each having a pitch p and a width w, this condition is equivalent with an equation that replaces the heat conductivity λ with λ×w/p. Therefore, in the equilibrium, the heat conduction equation of the square mesh structure formed by plural first rod members each having a pitch p and a width w is expressed by Equation 20 below:

$$0 = \partial^2 \Delta T / \partial r^2 + 1/r \times \partial \Delta T / \partial r + q0/(th \times \lambda \times W/p) - \sigma \times \epsilon \times (T^4 - T_0^4)$$ [EQUATION 20]

The temperature distribution of the mesh structure is a function of q0/(λ×th×w/p) when the heat value escaping due to the radiation is disregarded in the fourth term in the right side. Equation 20 is turned into Equation 21 below where A is a numerical aperture of the mesh structure and w/p=√A:

$$0 = \partial^2 \Delta T / \partial r^2 + 1/r \times \partial \Delta T / \partial r + q0/(th \times \lambda \times A^2) - 94 \times \epsilon \times (T^4 - T_0^4)$$ [EQUATION 21]

This mesh structure is configured to allow the heat absorbed by the mesh structure to release to the surrounding of the mesh structure while the temperature is constant around the mesh structure. Therefore, there is a relationship between the outer diameter of the mesh structure and the energy absorbed per unit area. When the energy absorbed per unit area increases, the temperature of the mesh structure rises. Therefore, as the absorbed energy increases, the mesh structure must be made small. The size of the mesh size is defined as the energy absorbed per unit area.

Figure 12:
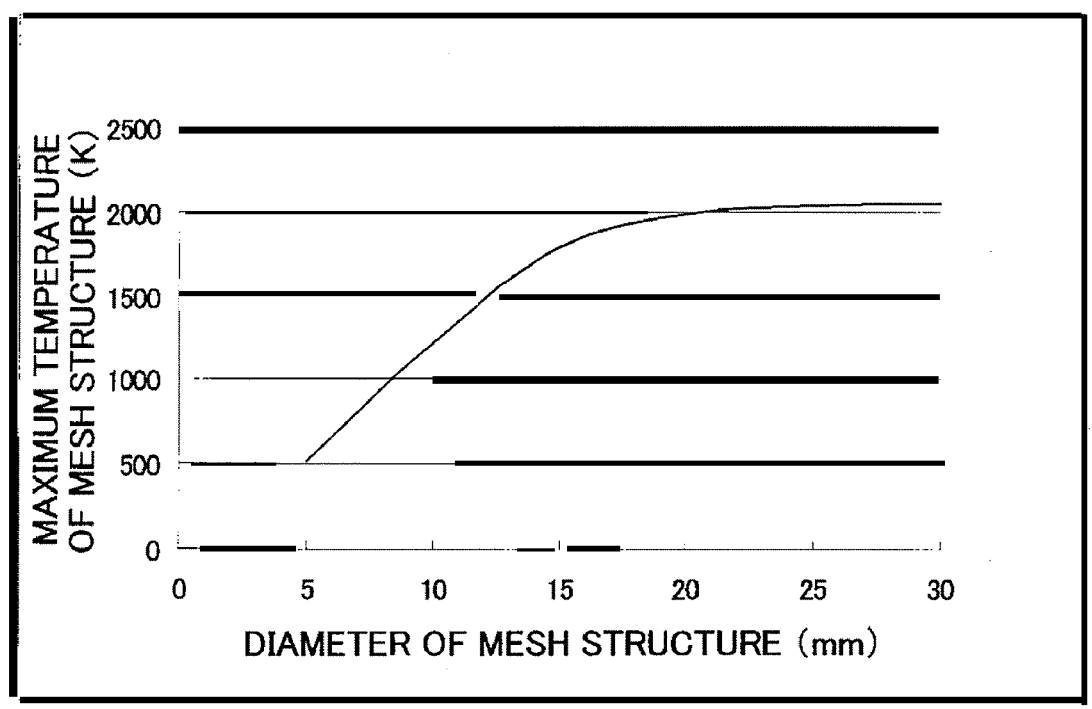
FIG. 12 is a graph showing a temperature of the center of the mesh structure to a diameter of the light transmitting film.
Figure 13:
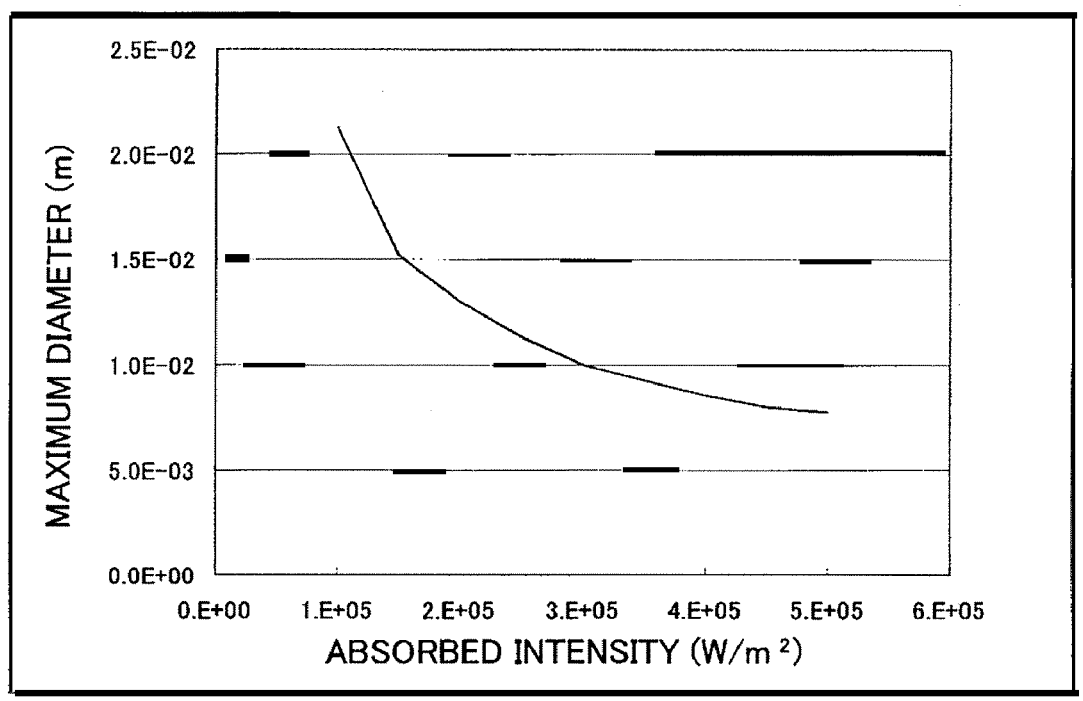
FIG. 13 is a graph showing a relationship between the maximum diameter and the absorbed intensity of the mesh structure.

FIG. 12 shows the temperature of the center of the mesh structure in which it is made of Mo, has a thickness of 100 [μm], a numerical aperture of 81% (with a pitch of 100 [μm] and a width of 10 [μm] of the first rod member in the mesh structure), and an energy absorbed per unit area of 20 [W/cm²]. In FIG. 12, an abscissa axis is an outer diameter of the mesh structure, and an ordinate axis is the temperature of the center of the mesh structure, which is the maximum temperature of the mesh structure. On the premise that the mesh structure is adhered to the light transmitting film, assume that the limitation temperature of the mesh structure is the maximum temperature of 1600 [K] of the adhesive agent. The maximum diameter of the mesh structure is 13.1× $10^{-3}$ [m] when the energy is 20×10⁴ [m]. FIG. 13 shows a result of the absorbing intensity and the maximum diameter of the mesh structure.

Figure 14:
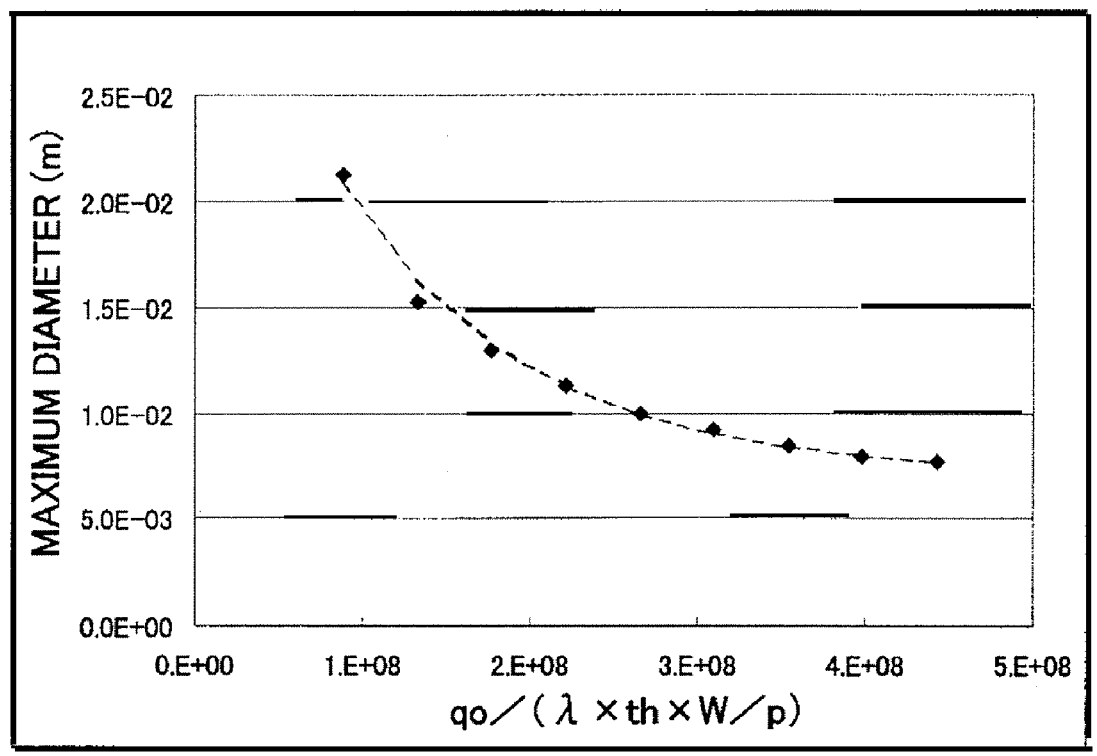
FIG. 14 is a graph showing a relationship between the maximum diameter and the absorbed intensity of the mesh structure.

It is understood from Equation 20 that the heat conduction equation of the mesh structure is expressed by a variable of x=q0/(λ×th×w/p). Therefore, FIG. 13 can be replaced with FIG. 14 in which an abscissa axis denotes x, and an ordinate axis denotes a maximum diameter d of the mesh structure. The exponent approximated curve is indicated as a broken line. The approximated equation is expressed in Equation 22 below where d [m] is a maximum diameter.

$$d = 3 \times 10^{-2} \times \exp(-9 \times 10^{-9} \times x) + 7.2 \times 10^{-3}$$ [EQUATION 22]

Here, x is expressed by Equation 23 below where q0 is an energy absorbed per unit area [W/m²], λ is a heat conductivity [W/m/K], th is a thickness [m] of the mesh structure, w is a width of the first rod member in the mesh structure, and p is a pitch [m] of the first rod member in the mesh structure.

$$x = q0/(\lambda \times th \times w/p)$$ [EQUATION 23]

Alternatively, x is expressed by Equation 24 below where A is a numerical aperture of the mesh structure:

$$x = q0/(\lambda \times th \times \sqrt{A})$$ [EQUATION 24]

The maximum diameter s [m] of the mesh structure necessary to maintain the maximum temperature of the mesh structure to be the heatproof temperature of the adhesive agent of 1600 [K] or below:

$$s < 3 \times 10^{-2} \times \exp(-9 \times 10^{-9} \times x) + 7.2 \times 10^{-3}$$ [EQUATION 25]

The heat conductivity λ of the principal material of the mesh structure is expressed by Equation 26:

$$\lambda > 40 [W/m/K]$$ [EQUATION 26]

The material that satisfies Equation 26 is Tungsten (W), Copper (Cu), Tantalum (Ta), Nickel (Ni), etc. Cu has a melting point of 1,358 [K], but a heat conductivity of about 350 [W/m/K] at 1,000 [K], three times as large as that of Mo. Therefore, when Cu has the same thickness of 100 [μm] as Mo, the maximum temperature can be maintained to be 1,000 [K] or below:

Ni evaporates at a rate of 10 [μm/hr] when the temperature exceeds 1,600 [K], use of it becomes difficult. In other words, when the maximum temperature exceeds 1,600 [K], the material usable for the mesh structure is limited and thus the maximum temperature is preferably maintained 1,600 [K] or below.

The above description assumes the contour of the filter as a circle, but the filter shape does not have to be a circle. For example, when a large-aperture filter is required, it is conceivable that a filter is partitioned into small areas (so that it has a second rod member structure) using a second rod member that has a sectional area larger than the mesh structure and is considered to be at substantially homoiothermal. In this case, each mesh structure becomes a repetition of a square or a hexagon, not a circle. In addition, the minimum distance dominates in the heat release, the maximum diameter s of the mesh structure shown in Equation 25 is a diameter of the smallest circle among the circles that contact at least three sides of one section in the mesh structure.

The material that has a variable heat conductivity λ according to the temperature has the maximum temperature of 1,000 [K] that is an average temperature between 1,600 [K] and the room temperature of 300 [K].

As discussed above, it is necessary that the temperature rise of the second rod member structure is smaller than the temperature rise of the mesh structure. For this purpose, it is necessary that the heat value per unit time through each second rod member should be larger than the heat value per unit time through each first rod member in the mesh structure. In order to realize this scheme, for example, coolant is flowed in the second rod member in the second rod member structure or a heat pipe may be provided. This can also be realized by making a sectional area of the second rod member on a plane perpendicular to the temperature gradient direction larger than the sectional area of the first rod member in the mesh structure. Alternatively, the heat conductivity of the material of the second rod member may be larger than the heat conductivity of the material of the mesh structure.

As discussed above, the size of one section in the mesh structure is determined by Equation 10 or 11, and the size of the entire mesh structure is determined by Equations 23 to 25. As a result, a shape of the filter is determined which includes the light transmitting film and the meshed member. The filter may further include a member having a second rod member. Actual mesh structures having the mesh structure and no mesh structure are calculated where the filter has a diameter of 30 [mm], an emission frequency 10 [kHz], and an intensity of $1 \times 10^5$ [W/m²].

Assume that the width/pitch of the first rod member in the mesh structure is made 0.25 (numerical aperture of 56%) and the mesh is made of Mo. In this case, since the heat conductivity λ at 1,000 [K] is 113 [W/m/K], the thickness of the mesh structure is 97 [μm] or greater. Conceivably, the thickness of the mesh structure is about 115 [μm]. In this case, since a size of one section in the mesh structure is 30 [μm] or smaller from Equation 10, the first rod member has a width of 10 [μm] and a pitch of 40 [μm].

The entire area of the filter can be maintained constant and the area of the mesh structure can be made small by providing the filter with the second rod member structure, by exhausting the heat of the mesh structure to the second rod member or absorbing the heat in the second rod member, by maintaining the temperature of the second rod member constant. For example, a second rod member is arranged so that the size of the mesh structure is partitioned by a diameter of 15 [mm], and a thickness of 100 [μm] is set, the first rod member's width/pitch can be made 0.06 (numerical aperture of 88%) from Equations 23 and 25. In that case, a size of one section in the mesh structure becomes 30 [μm] or smaller from Equation 10, the first rod member has a width of 2 [μm] and a pitch of 32 [μm].

Thus, the filter having a second rod member structure can improve the numerical aperture in comparison with the filter having no the second rod member structure, if the mesh structure has the same thickness.

A description will now be given of specific embodiments according to the present invention.

FIRST EMBODIMENT

FIG. 1 is a schematic sectional view of a light source unit 1 according to one aspect of the present invention. In FIG. 1, 10 denotes a light source chamber, 11 is an electrode, 12 is a condenser mirror, 13 is a debris remover, 14 is a mirror support part, and 100 is a filter.

The light source unit 1 is a light source unit that generates plasma PL, condenses the EUV light EL radiated from the plasma PL, forms an intermediate condensing point CP, and supplies the EUV light to the subsequent optical system. By way of an example, this embodiment regards the subsequent optical system as an illumination optical system in the exposure apparatus. In FIG. 1, 20 denotes an illumination optical system chamber, 21 and 22 denote mirrors. The light source unit 1 is implemented as a DPP light source in this embodiment. However, the light source unit 1 is not limited to the DPP light source, and may be an LPP light source or another type of light source.

In the light source unit 1, when a voltage is applied to the electrode 11, the electric field condenses on the light emitting point, the plasma PL is generated from Xe, and the plasma PL radiates various lights including the EUV light EL. The repetitive frequency of the radiated EUV light source EL is 10 [kHz]. High-speed particles, called debris, disperse from Xe and the material of the electrode 11 together with the light from the plasma PL. The debris remover 13 removes the debris.

The debris remover 13 includes plates parallel to the optical axis, and inert gas, such as Ar, supplied between the plates. The high-energy debris generated from the electrode 11 collides with the Ar gas, changes the traveling direction, and diverts from the optical path of the EUV light EL.

The EUV light EL from which the debris is removed is reflected on the condensing mirror 12 that includes a rotationally symmetrically, oblique incidence mirror and condensed on the intermediate condensing point CP. This embodiment combines plural condenser mirrors 12, and improves the condensing efficiency. The EUV light EL that is condensed on the intermediate condensing point CP diffuses again, and is shaped by the mirrors 21 and 22 arranged in the illumination system chamber 20. A multilayer coating having a periodic structure of Mo and Si is formed on a surface of the mirrors 21 and 22. The EUV light EL has an annular intensity distribution that has a central area which no light reaches, downstream the intermediate condensing point CP.

The light source chamber 10 has a degree of vacuum of about $1 \times 10^{-1}$ [Pa] due to the gas, such as Ar. The illumination optical system chamber 20 should be maintained at about $1\times10^{-5}$ [Pa]. In order to maintain the pressure difference between the light source chamber 10 and the illumination optical system chamber 20, the inventive filter 100 is provided, thereby preventing an inflow of the Ar gas etc. from the light source chamber 10 to the illumination optical system chamber 20, and maintaining the degree of vacuum about $1\times10^{-5}$ [Pa] in the illumination optical system chamber 20.

Figure 2:
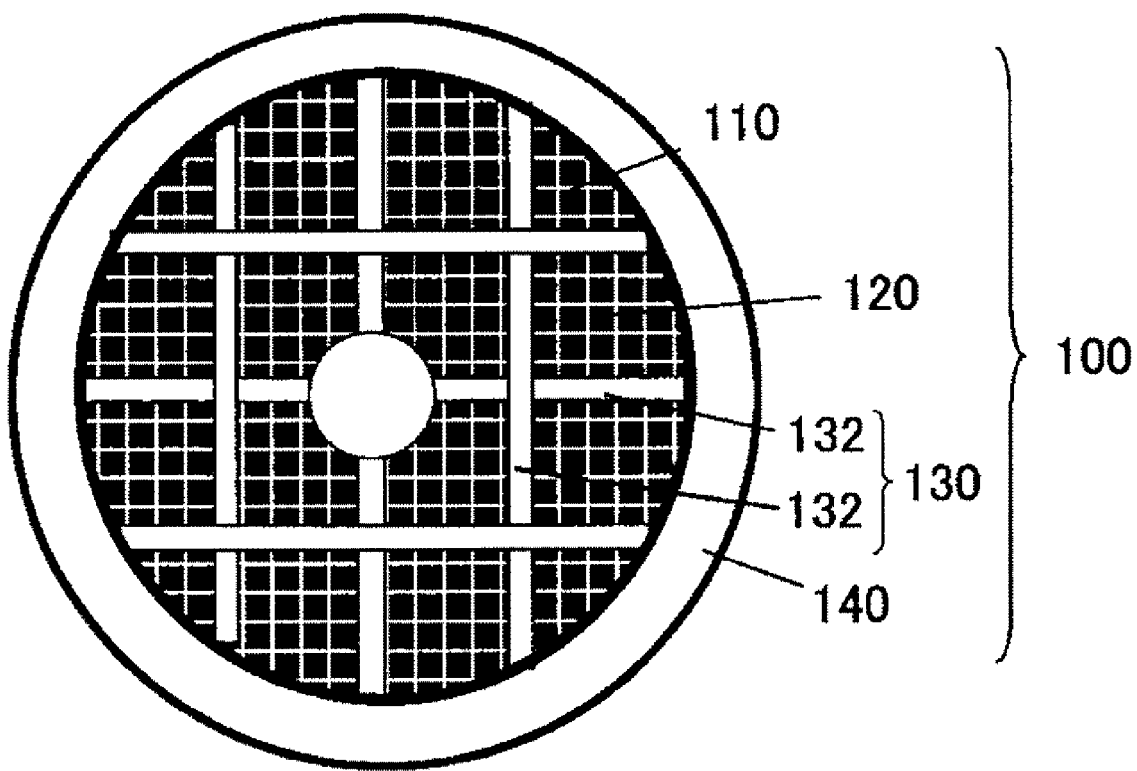
FIG. 2 is a schematic plane view showing a structure of a filter shown in FIG. 1.
Figures 3A, 3B:
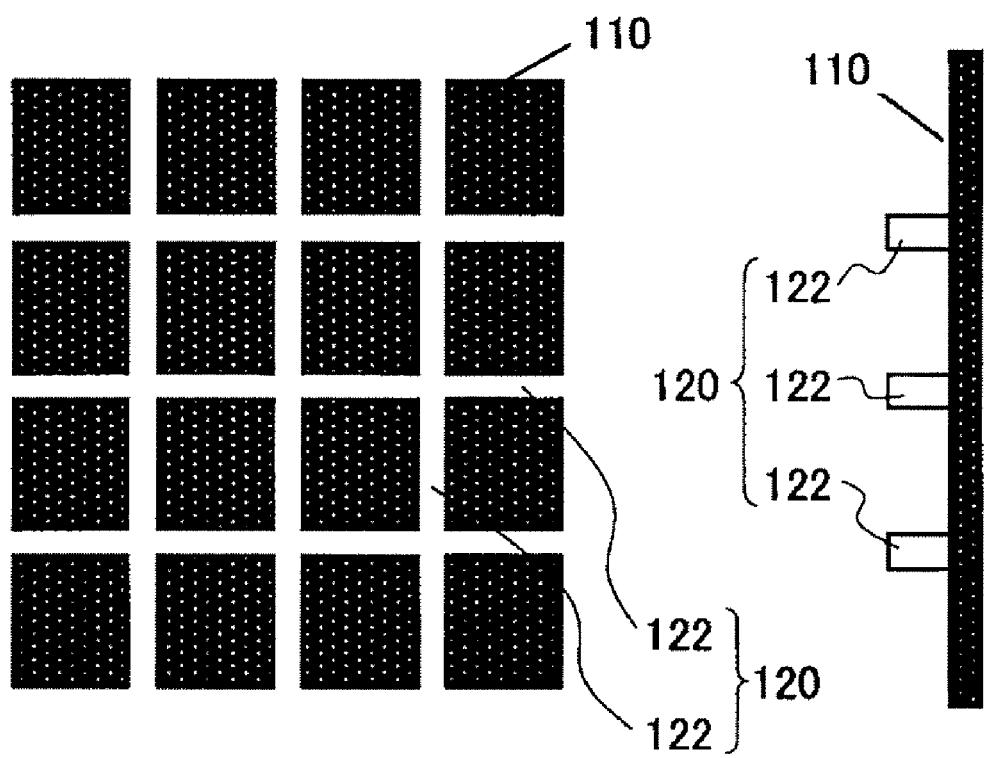
FIGS. 3A and 3B are schematically enlarged plane and sectional views showing a light transmitting film and a first rod member having a mesh structure and plural rod members shown in FIG. 2.

FIG. 2 is a schematic plane view showing a structure of the filter 100. The filter 100 includes a light transmitting film 110 that transmits the EUV light EL, a first (rod) member 120 that supports the light transmitting film 110, a second (rod) member 130 that supports the first member 120. The first member 120 has a mesh structure that includes plural first rod members 122 as shown in FIG. 3. The second member 130 includes the second rod member structure that has plural second rod members 132. The first member 120 and the second member 130 are fixed onto a filter frame 140. The light transmitting film 110 is made of Zr and has a thickness of 0.2 [μm] in this embodiment. Here, FIGS. 3A and 3B are schematic enlarged plane and sectional views of the first member 120 having the mesh structure that includes the transmitting film 110 and the plural first rod members 122. The first rod member and the second rod member have different rod members having different sectional areas. Each first rod member intersects another first rod member, and another second rod member intersects another second rod member. Both members form an approximately reticulation.

This embodiment arranges the filter 100 at a position apart from the intermediate condensing point CP, where the intensity per unit area of the EUV light EL is low. The average intensity absorbed by the filter 100 at this position is $1\times10^4$ [W/m$^2$].

The size defined by the mesh structure needs to satisfy Equation 10 or 11 above. The frequency F of the light source unit 1 is 10 [kHz] in this embodiment, and the mesh structure having a maximum diameter d<0.3 [mm] is obtained. The size of the partition in the mesh structure or the pitch is 0.1 [mm] in this embodiment. The first rod member 122 in the mesh structure has a thickness of 100 [μm] and a width 10 [μm], and is made of Mo.

The second rod member 132 in the second rod member structure has a thickness and a width of 1 [mm], a pitch of 10 [mm] in the longitudinal and lateral direction, and is made of copper. The cooling water flows through a filter frame 140, and the temperature is maintained constant. Characteristically, the sectional area of the second rod member 132 is much larger than that of the first rod member 122 in the mesh structure. In this embodiment, the sectional area of the second rod member 132 is 1,000 times as large as the sectional area of the first rod member 122. Therefore, the heat of the mesh structure can be released to the filter frame 140 through the second rod member 132.

Equation 25 determines a pitch of the second rod member 132. Mo has a heat conductivity λ of 113 [W/m/K] at 1,000 [K] and thus $x=9\times10^7$. The maximum diameter of the mesh structure is calculated as 0.021 [m]. In the second rod member 132 of the square grating, the size of the mesh structure is defined as a length of one side of the square grating partitioned by the second rod member 132. Since the temperature of the mesh structure having a pitch of 0.021 [m] does not exceed 1,600 [K], it is understood that it is applicable, for example, to the EUV exposure apparatus.

When the EUV light EL enters the filter 10 after the light source unit 1 starts emissions, the light transmitting film 110 absorbs the energy and its temperature rises during the emissions of the EUV light EL. The heat absorbed in the light transmitting film 110 in a downtime of the emission of the EUV light between pulses. The heat absorbed in the light transmitting film 110 is released by the first member 120 having the mesh structure, but the heat capacity of the mesh structure is remarkably greater than the heat capacity of the light transmitting film 110. Therefore, the temperature of the mesh structure slightly rises. After this is repeated, the temperature of the mesh structure gradually rises, but the heat of the mesh structure is released to the second rod member 132 due to (the second member 130 having) the second rod member structure that thermally contacts the mesh structure. The sectional area of the second rod member 132 is 100 times as large as the sectional area of the first rod member 122 in the mesh structure, and has the heat conductivity ten times as large as that of the first rod member 122. Therefore, the heat of the mesh structure is immediately released to the filter frame 140. Therefore, the temperature of the second rod member 132 hardly rises and the second rod member 132 can be regarded as a warm bath. Since the size of the mesh structure is determined irrespective of the size of the filter 100, the maximum temperature of the filter 100 does not change even when the filter 100 is made larger.

Figure 4:
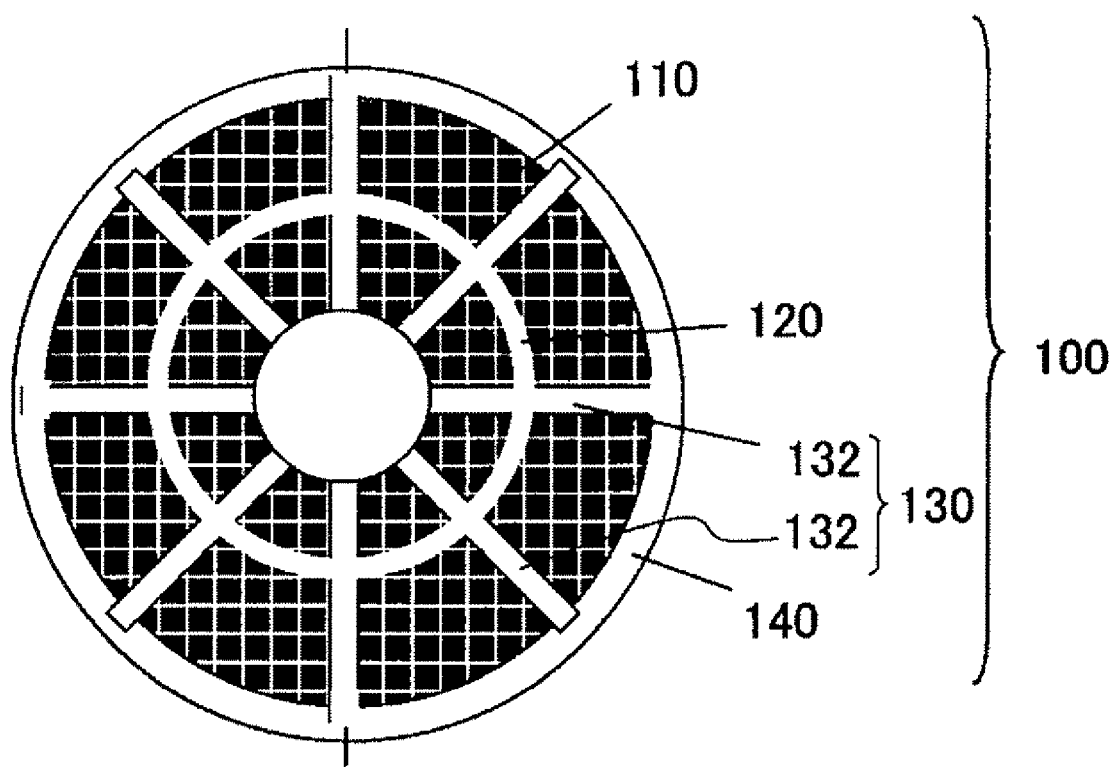
FIG. 4 is a schematic plane view showing one illustrative structure of the filter shown in FIG. 1.

This embodiment arranges the second rod members 132 in a grating shape, but the second rod members 132 may be arranged radially as shown in FIG. 4, and the cooling water may be flowed through it. In particular, the intensity distribution of the EUV light EL incident upon the filter 100 is rotationally symmetrical, and the temperature is constant in the circumferential direction. Therefore, the heat cannot effectively released when the second rod member 132 is mere metal, but the heat can be effectively released by flowing the cooling water. When the second rod members 132 are arranged in a radial shape, mere metal can effectively release the heat. Here, FIG. 4 is a schematic plane view showing one illustrative structure of the filter 100.

A mirror support part 14 that fixes the condenser mirror 12 shown in FIG. 1 blocks the EUV light EL, and casts a shadow on the filter 100. The second rod members 132 when arranged at the shadow position of the mirror support part 14 can introduce a sufficient amount of the EUV light EL to the illumination optical system chamber 20 without lowering the numerical aperture of the filter 100. When the second rod members 132 are arranged in a circumferential direction, the second rod members 132 may be arranged at a shadow position of the inside condenser mirror 12. While this embodiment provides the cooling pipe for circulating the coolant through the second rod members 132, a heat pipe may be provided.

The light transmitting member 110, the first member 120 having the mesh structure, and the second member 130 having the second rod member structure thermally contacts one another. More specifically, the light transmitting film 110 thermally contacts the mesh structure (first member 120) so that the heat absorbed in the light transmitting film 110 flows to the mesh structure (first member 120). In addition, the mesh structure (first member 120) thermally contacts the second rod member structure (second member 130) so that the heat absorbed in the mesh structure (first member 120) is released to the second rod member structure (second member 130). The mesh structure (first member 120) is provided on one surface of the light transmitting film 110, and the second rod member structure (second member 130) is provided on another surface. The thermal contact means that the heat of the mesh structure is released to the second rod member structure via the light transmitting film 110 even when the mesh structure does not directly contact the second rod member structure.

The first member uses, but is not limited to, the mesh structure in the first embodiment. For example, plural first rod members in the first member in this embodiment do not have to intersect with each other (or do not need the mesh structure), and may include plural first rod members that do not intersect with each other. While these plural first rod members may be parallel to each other, they are preferably arranged in a radial shape around the center of symmetry (point or axis) so as to work under the temperature distribution with an approximately point symmetry (or axial symmetry). This is true of plural second rod members of the second member. However, preferably, at least one of the plural first rod members and plural second rod members intersect with each other. Although the first rod members do not intersect with each other and the second rod members do not intersect with each other, the first rod member may intersect with the second rod member. The "intersection," as used herein, covers a contact between one end and the other end or a contact between one end and a part other than the other end as well as a contact between a part other than the one end and a part other than the other part (with or without an interposition of the light transmitting film and part).

SECOND EMBODIMENT

A description will be given of a material used for the mesh structure (first member 120). The temperature of the mesh structure can become higher than 1,000 [° C.]. It is an object of the mesh structure is to promptly release the heat absorbed in the light transmitting film 110 to the second rod member 132. The principal characteristics required for the mesh structure are a high melting point, a high heat conductivity, and a low evaporation rate. The high melting point requires 1,300 [° C.] or higher. Therefore, the mesh structure is preferably made of a material having a heat conductivity of 40 [W/m/K] or higher at 1,000 [° C.], such as copper and molybdenum.

For the low evaporation rate, the mesh structure is a heat conductive member, and a mere non-evaporation is insufficient. If the radiation is not considered, when the mesh structure evaporates and becomes thinner by 10%, the temperature may be considered to rise by about 10%. Therefore, as the temperature rises, the mesh structure becomes thinner, and as the mesh structure becomes thinner, the temperature can easily rise, promoting the temperature rise. In other words, as the temperature of the mesh structure rises, the mesh structure accelerates thinning. In addition, the material (contaminant) evaporated from the mesh structure is likely to adhere to the condenser mirror 12 and the mirrors 21 and 22, and to contaminate the optical element, lowering the reflectance of the optical element.

It is known that the evaporation rate of the high melting material is generally small. However, the high melting point does not always have a high heat conductivity. Table 1 shows the heat conductivities, and evaporation rates of representative high heat conductive materials and high melting materials.

[TABLE 1]

Heat Conductivities, And Evaporation Rates Of Representative High Heat Conductive Materials And High Melting Materials

|  |  | Cu | Ni | Zr | Mo | W |
|---|---|---|---|---|---|---|
| 0.01 µm Transmittance @13.5 nm |  |  |  | 0.97 | 0.94 | 0.76 |
| Heat Conductivity (973 K) | W/K/m | 354 | 71 | 21 | 113 | 119 |
| Melting Point | K | 1356 | 1726 | 2128 | 2896 | 3680 |
| Evaporation Rate (@1300 K) | µm/hr | 3.E+00 | 5.E−03 | 2.E−10 | 3.E−12 | 3.E−20 |
| Evaporation Rate (@1800 K) | µm/hr |  |  | 2.E−03 | 1.E−04 | 3.E−10 |

It is understood from Table 1 that copper's heat conductivity is several times as large as those of the other materials. This indicates that when mesh structure uses copper, the temperature's rise can be one-nth as small as those of the other materials. However, the evaporation rate is 3 [µm/hr], and the mesh structure becomes thin within a few hours and cannot be used.

Figure 5:
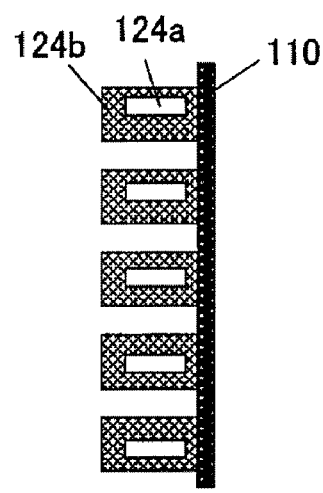
FIG. 5 is a schematic sectional view showing one illustrative mesh structure.

Accordingly, this embodiment makes the inside of the mesh structure of copper, as shown in FIG. 5, and covers the surface 124b with tungsten having a low evaporation speed, forming a mesh structure. The mesh structure is formed by forming the mesh structure using copper as usual, forming molybdenum and tungsten on its surface by about 1 [µm], and then providing the light transmitting film 110.

The evaporation rate of tungsten is $3 \times 10^{-20}$ [µm/hr], and the evaporation can be disregarded indeed. The mesh structure in which the material covering its surface 124b has an evaporation rate smaller than that of its inside 124a, thereby providing a structure optimal, for example, to the filter for the exposure apparatus. Here, FIG. 5 is a schematic sectional view showing one illustrative mesh structure.

While this embodiment uses tungsten for a material covering the surface 124b of the mesh structure, this material is not limited to tungsten as long as the material has an evaporation rate smaller than that of the inside 124a of the mesh structure. For example, Mo has such a low evaporation rate of $3 \times 10^{-12}$ [µm/hr], and is usable for a material covering the surface 124b of the mesh structure. Ni and Zr are also used for the material covering the surface 124b of the mesh structure. The applicable material preferably transmits the EUV light to some extent, e.g., with a transmittance of 0.01 or greater for a thickness of 0.01 µm, preferably with a transmittance of 0.1 or greater for a thickness of 0.01 µm, and preferably with a transmittance of 0.5 or greater for a thickness of 0.01 µm.

THIRD EMBODIMENT

This embodiment addresses a material used for the light transmitting film 110. The temperature of the light transmitting film 110 can exceed 1,500 [° C.] and sometimes becomes 1,500 [° C.]. The light transmitting film 110 has an object to transmit the EUV light EL. The required characteristics are a high transmittance to an exposure wavelength, a high melting point, a high heat conductivity, a low evaporation rate, and a high radiation index. The high melting point requires 1,500 [° C.] or higher. The low evaporation rate intends to prevent the light transmitting film 110 from thinning and its temperature from rising due to the reduced absorption amount or from partially thinning and becoming fragile. In addition, the evaporated material is likely to adhere to the condenser mirror 12 and the mirrors 21 and 22, and to contaminate the optical element.

Figure 6:
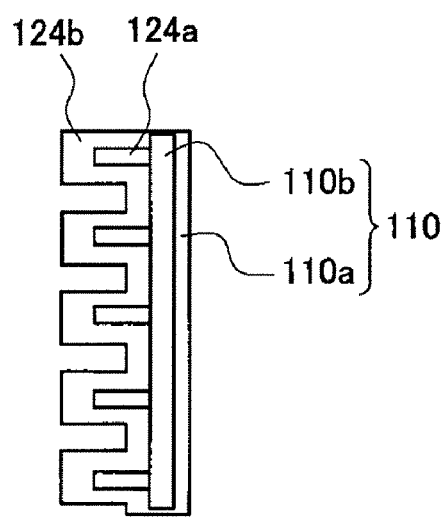
FIG. 6 is a schematic sectional view showing one illustrative light transmitting film shown in FIG. 1.

This embodiment covers the surface 110a of the light transmitting film 110 with a material different from that for the inside 110b, as shown in FIG. 6. As indicated in Table 1, the evaporation rate of Molybdenum is 1/20 as high as that of Zr but the transmittance of Mo to the EUV light is lower than Zr. For example, in a light transmitting film having a thickness of 0.2 [μm], the transmittance of molybdenum is 30% and the transmittance of Zr is 50%, and Zr has a higher transmittance. Here, FIG. 6 is a schematic sectional view showing one example of the light transmitting film 110.

When the inside 110b at the center of the light transmitting film 110 is made of Zr, and the surface 110a is evaporated with Mo with a thickness of about 10 [nm], the filter function can be maintained until Mo evaporates (for 100 hours). Irrespective of the maximum temperature of 1,800 [K], the emitting time period of the EUV light EL is short, and there is a pulse interval ten times as long as the emitting time period. Therefore, it takes about 1,000 hours for Mo to finish evaporating.

The light transmitting film 110 in which the material covering its surface 110a has an evaporation rate lower than the material of the inside 110b of the light transmitting film 110, has a high transmittance to the EUV light EL and can retard the evaporation rate sufficiently, for example, enough for the filter of the EUV exposure apparatus.

The filter 100 of this embodiment is made by forming the light transmitting film 110 as usual, and then simply vapor-depositing Mo on both surfaces.

In vapor-depositing Mo on only one surface, not both surfaces, it is preferable that a surface on which Mo is not vapor-deposited is faced to the light source side, and a surface on which Mo is vapor-deposited is faced to the plate side (or the illumination optical system side) of the exposure apparatus.

FOURTH EMBODIMENT

The first to third embodiments form a second rod member structure (second member 130) separately from the mesh structure (first member 120). However, the second rod member structure does not have to be formed separately from the second rod member structure or the mesh structure, as long as the second rod member structure serves to efficiently release the heat to the outside of the mesh structure of the filter 100. For example, first rod members each wider than the first rod member 122 in the mesh structure are arranged at predetermined pitches, and the wider first rod member may be regarded as a second rod member 132. In other words, the sectional area of the second rod member 132 on a plane perpendicular to the temperature gradient direction may be greater than the sectional area of the mesh structure. For example., since when the second rod member 132 is arranged parallel to a steeper temperature gradient direction, the heat can be released efficiently, the sectional area of the radial first rod member may be increased among the first rod members 122 in the mesh structure.

FIFTH EMBODIMENT

The first to fourth embodiments arranges the filter 100 at a position other than the intermediate condensing point CP for the light source unit 1 that condenses the EUV light EL radiated from the plasma PL onto the intermediate condensing point CP, and lowers the intensity per unit area incident upon the filter 100. This filter 100 is applicable to the exposure apparatus that collimates the EUV light EL radiated from the plasma PL, and introduces the collimated light to the illumination optical system chamber. For the light source unit or the EUV exposure apparatus, which collimates the EUV light EL from the plasma PL and introduces the collimated light to the illumination optical system chamber, it is conceivable that the condenser optical system directly collimates the light or another mirror collimates the EUV light EL reflected by the condenser optical system. However, in either case, the filter 100 may be arranged at a position having the necessary intensity.

SIXTH EMBODIMENT

A method for manufacturing the filter 100 that includes the light transmitting film 110, the first member 120 having the mesh structure, and the second member 130 having the second rod member structure. One method for manufacturing the filter 100 forms the light transmitting film 110 on the substrate, and then forms a mesh structure (first member 120) using plating or lift-off. Another method forms a self-sustaining mesh structure, and fixes the light transmitting film 110 using the adhesive agent. The method for fixing the mesh structure and the light transmitting film 110 or the second rod member structure (second member 130) using the adhesive agent is likely to emit desorption gas from the adhesive agent when the adhering part becomes at a high temperature, and the desorption gas contaminates the optical elements. Te filter 100 when arranged at the plasma PL side facing the adhesive surface can prevent contaminations of the mirrors 21 and 22 at the illumination optical system chamber. Since the degree of vacuum is not so high, the spread of the desorption gas emitted from the adhesive agent is smaller than the spread of the illumination optical system chamber 20.

Assume that the condenser mirror 12 in the light source chamber 10 shown in FIG. 1 uses an obliquely incident mirror, and for the mirrors 21 and 22 in the illumination optical system chamber 20 uses a multilayer mirror. In that case, the reflectance of the multilayer mirror lowers further than that of the obliquely incident mirror if the contaminants similarly adhere. It is therefore effective to extend the life of the mirror by arranging the filter 100 while facing the adhesive surface to the plasma PL side.

SEVENTH EMBODIMENT

A description will be given of the life of the filter 100. A drop of the maximum temperature of the filter 100 is effective to prolong the life of the filter 100. For this purpose, the intensity of the EUV light EL irradiated onto the filter 100 may be made small. Accordingly, it is effective to arrange the filter 100, as shown in FIG. 1, downstream at least one mirror in the illumination optical system chamber 20, e.g., position α or β. The reflectance of the mirror to the EUV light is at most 70%, and when the filter 100 is arranged at the position β downstream the two mirrors, the intensity of the EUV light EL irradiated onto the filter 100 becomes half the intensity of the EUV light EL that has just emitted from the light source chamber 10. Even when the filter 100 is arranged at position γ at which the EUV light has been just incident upon the illumination optical system chamber 20, the intensity of the EUV light EL is small, and the life can be prolongs in comparison with an arrangement of the filter 100 in the light source chamber 10.

In using the obliquely incident mirror for the condenser mirror 12 shown in FIG. 1, the intensity of the light other than the exposure wavelength necessary for the exposure or so-called out-of-band light is 10 times as high as the intensity of the exposure wavelength. In that case, when one multilayer mirror reflects the EUV light EL from the plasma PL, the reflecting intensity of the exposure wavelength is 70% but it hardly reflects the lights other than the exposure wave range or out of band. Therefore, the EUV light EL attenuates down to ⅕ to 1/10 as high as the intensity of the EUV light that has just emitted from the light source chamber 10, and the thermal load to the filter 100 extremely reduces.

On the other hand, it is one object of the filter 100 is to protect the mirror 21 and 22, and the filter 100 when arranged downstream the mirrors 21 and 22 can achieve this object. However, the mirrors 21 and 22 that receive the light first in the illumination optical system chamber 20 do not require the high precision necessary for another mirror, and are formed relatively inexpensively on the assumption of the exchange.

EIGHTH EMBODIMENT

When the material having a radiation index is vapor-deposited on the surface of the light transmitting film 110 in the filter 100, it is possible to lower the temperature of the light transmitting film 110. The material having a high radiation index includes, for example, carbon, silicon carbide (SiC), nitrogen carbide, silicon, etc. Genuine carbon has an evaporation rate one-digit smaller than that of molybdenum (Mo), the radiation index is about 0.8, and the temperature of the light transmitting film 100 can be maintained at 1,000 [K] or smaller. Practically, it can be considered not to evaporate. SiC and $Si_3N_4$ have radiation indexes of 0.8 to 0.9, and can lower the temperature of the light transmitting film 110. Carbon, SiC and $Si_3N_4$ having a thickness of 0.01 [μm] have such a high transmittance as 94% to 95% to the wavelength of 13.5 nm, and are suitable in view of the transmittance.

NINTH EMBODIMENT

As described above, when the EUV light EL continues to emit at a high speed, the release of the absorbed heat becomes insufficient in comparison with the heat value absorbed in the light transmitting film 110, and the temperature of the light transmitting film 110 rises gradually. One conceivable measure is to slightly retard the emission frequency of the EUV light EL, but cutting out an emission of the EUV light regularly is expected to provide a similar effect. For example, the temperature can drastically be lowered with one pause of twenty emissions of the EUV light.

TENTH EMBODIMENT

Figure 15:
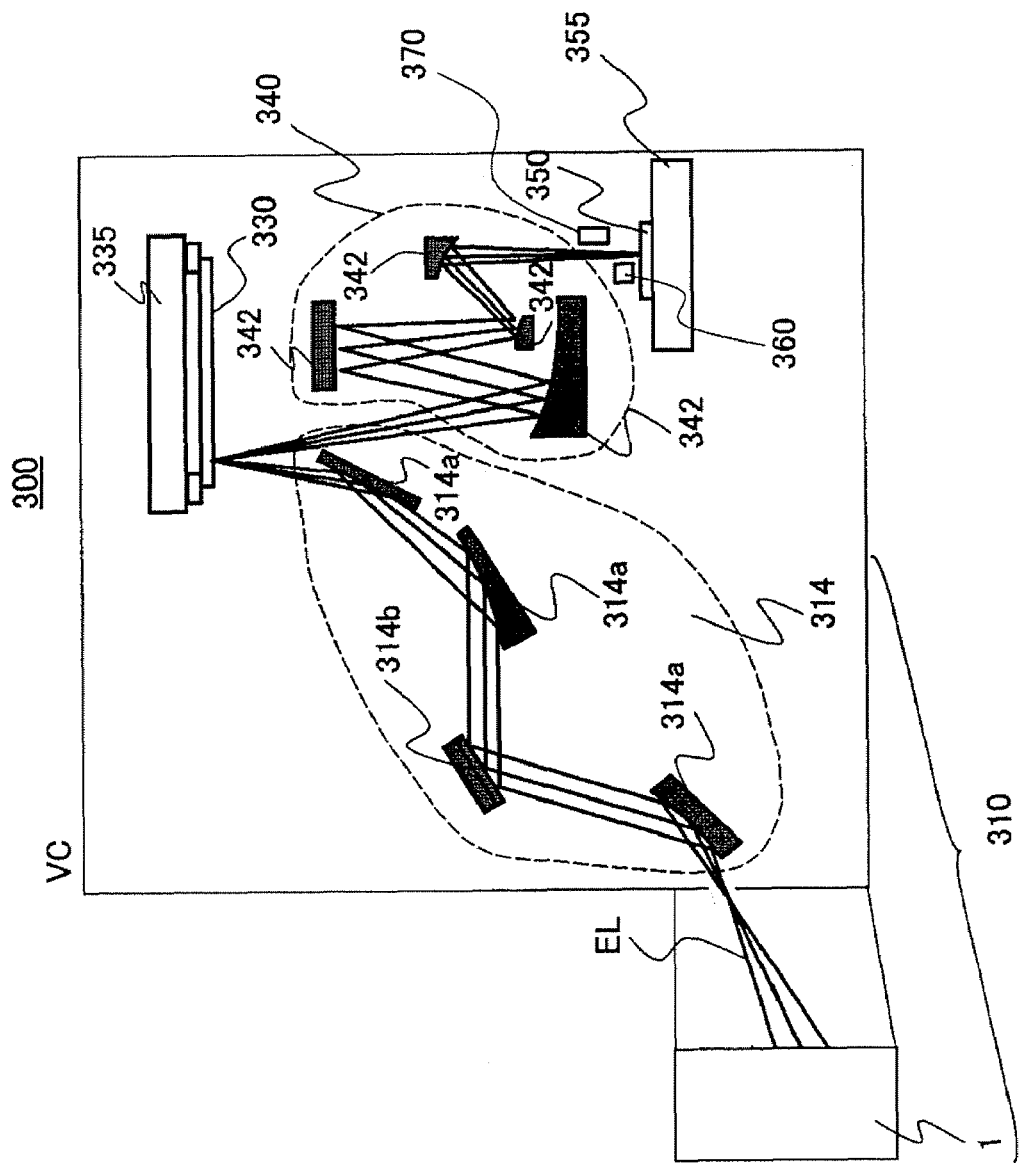
FIG. 15 is a schematic sectional view showing a structure of an exposure apparatus according to one aspect of the present invention.

Referring now to FIG. 15, a description will be given of an exemplary exposure apparatus 300 that applies the inventive light source unit 1. Here, FIG. 15 is a schematic block diagram of the exposure apparatus 300 according to one aspect of the present invention.

The inventive exposure apparatus 300 uses the EUV light (with a wavelength of, e.g., 13.4 nm) as an illumination light for exposure, and exposes onto a plate 350 a circuit pattern of a mask 330, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner," as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 15, the exposure apparatus 700 includes an illumination apparatus 300, an illumination apparatus 310, a mask stage 335 mounted with a mask 330, a projection optical system 340, a wafer stage 755 mounted with a plate 350 to be exposed, an alignment detecting mechanism 360, and a focus position detecting mechanism 370.

As shown in FIG. 3, a vacuum chamber VC is provided to maintain vacuum an optical path along which the EUV light EL travels. The EUV light EL has a low transmittance to air, and a reaction between the EUV light and a residue gas component, such as polymer organic gas, generates contaminants.

The illumination apparatus 310 illuminate the mask 330 using the EUV light that has a wavelength of, for example, 13.4 nm and an arc shape corresponding to an arc-shaped field of the projection optical system 340, and includes the light source unit 1 and an illumination optical system 314.

The light source unit 1 supplies the EUV light EL emitted from the plasma PL to the illumination optical system 314. The light source unit 1 may apply any of the above structures, and a detailed description thereof will be omitted.

The illumination optical system 314 includes mirrors 314a, and an optical integrator 314b. The mirror 314a reflects the EUV light supplied from the light source apparatus 1, and introduces the light to the subsequent optical element or system. The optical integrator serves to uniformly illuminate the mask 330 with a predetermined aperture. The illumination optical system 314 may have an aperture at a position conjugate with the mask 330, which aperture limits the illumination area of the marks 330 to the arc shape.

The mask 330 is a reflection mask, and has a circuit pattern (or image) to be transferred. The mask 330 is supported and driven by a mask stage 335. The diffracted light emitted from the mask 330 is projected onto the plate 350 after reflected by the projection optical system 340. The mask 330 and the plate 350 are arranged optically conjugate with each other. Since the exposure apparatus 300 of this embodiment is a scanner, the mask 330 and plate 350 are scanned to transfer a reduced size of a pattern of the mask 330 onto the plate 350.

The mask stage 335 supports the mask 330 and is connected to a moving mechanism (not shown). The mask stage 335 may use any structure known in the art. The moving mechanism (not shown) may include a linear motor etc., and drives the mask stage 335 at least in a direction X and moves the mask 330. The exposure apparatus 300 synchronously scans the mask 330 and the plate 350. Here, X denotes a scanning direction on the plane of the mask 330 or the plate 350, Y denotes a perpendicular direction to X, and Z denotes a direction perpendicular to the plane of the mask 330 or the plate 350.

The projection optical system 340 uses plural multilayer mirrors 342 to project a reduced size of a pattern of the mask 330 plane onto the plate 350 on the image plane. The number of plural mirrors is about four to six. For wide exposure area with the small number of mirrors, the mask 330 and plate 350 are simultaneously scanned to transfer a wide area that is an arc-shaped area or ring field apart from the optical axis by a predetermined distance. The projection optical system 340 has a NA of about 0.2 to 0.3.

The instant embodiment uses a wafer as the plate 350, but it may include a liquid crystal plate and a wide range of other objects to be exposed. Photoresist is applied onto the plate 350.

The plate 350 is held by the wafer stage 355 by a wafer chuck. The wafer stage 355 moves the plate 350, for example, using a linear motor in the XYZ directions. The mask 330 and the plate 350 are synchronously scanned. The positions of the mask stage 335 and wafer stage 355 are monitored, for example, by a laser interferometer, and driven at a constant speed ratio.

The alignment detecting mechanism 360 measures a positional relationship between the position of the mask 330 and the optical axis of the projection optical system 340, and a positional relationship between the position of the plate 350 and the optical axis of the projection optical system 340. The alignment detecting mechanism 360 sets positions and angles of the mask stage 335 and the wafer stage 355 based on the measuring result so that a projected image of the mask 330 may accord with the plate 350.

A focus position detecting mechanism 370 measures a focus position on the plate 350 surface. Control over a position and angle of the wafer stage 355 always maintains the plate 350 surface at an imaging position of the projection optical system 340 during exposure.

In exposure, the EUV light emitted from the illumination apparatus 310 illuminates the mask 330, and images a pattern of the mask 330 onto the plate 350 surface. This embodiment uses an arc or ring shaped image plane, scans the mask 330 and plate 350 at a speed ratio corresponding to a reduction ratio to expose the entire surface of the mask 330. The light source unit 1 in the illumination apparatus 310 in the exposure apparatus uses the filter 100 to prevent not only a reduction of the reflectance of the optical element in the illumination and projection optical systems 314 and 340, but also unevenness of the light intensity. Thereby, the exposure apparatus 300 can provide devices (such as semiconductor devices, LCD devices, image pickup devices (e.g., CCDs), and thin film magnetic heads) with a high throughput and good economical efficiency.

ELEVENTH EMBODIMENT

Figure 16:
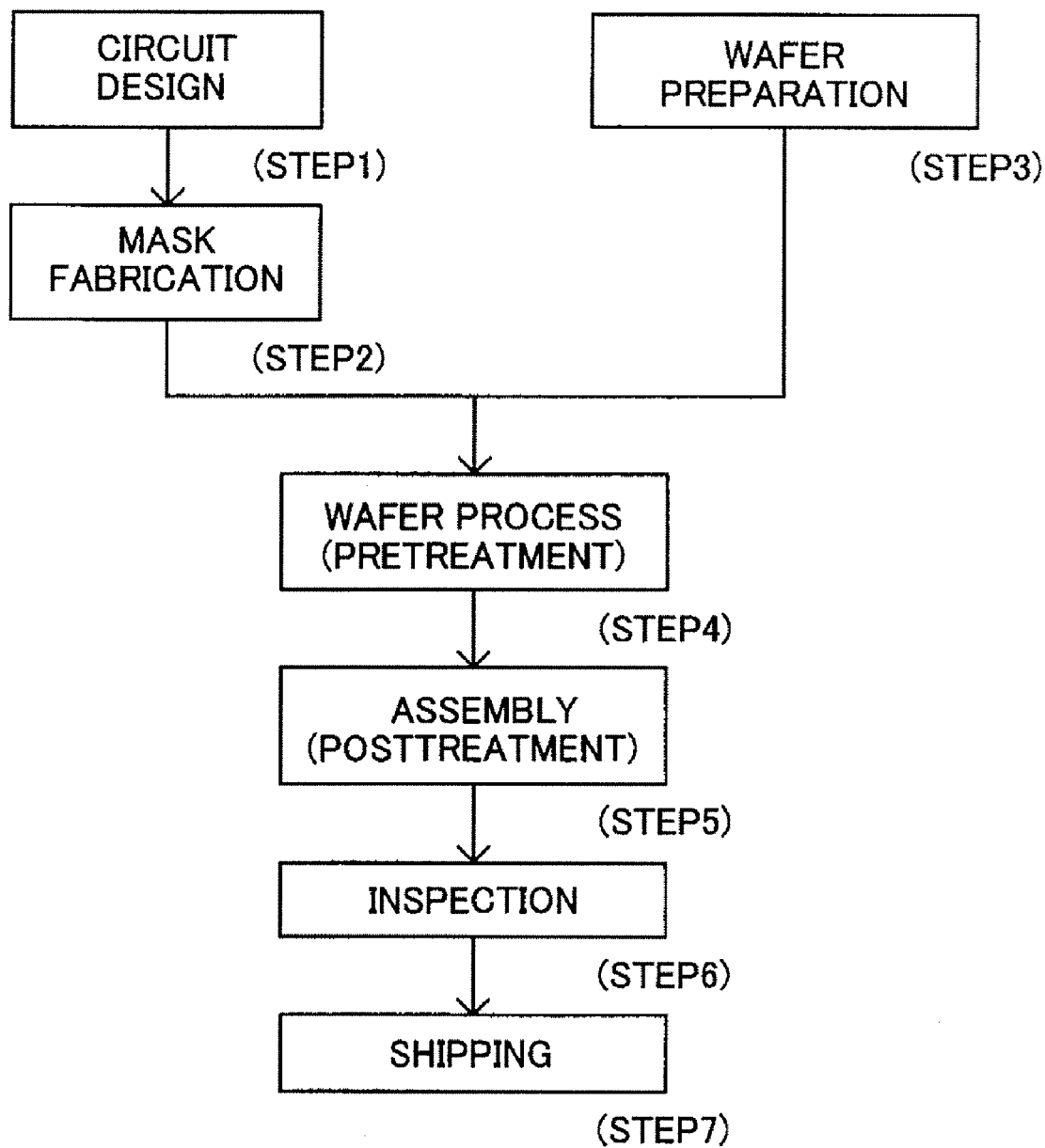
FIG. 16 is a flowchart for explaining a method for fabricating devices (semiconductor chips such as ICs, LSIs, and the like, LCDs, CCDs, etc.).
Figure 17:
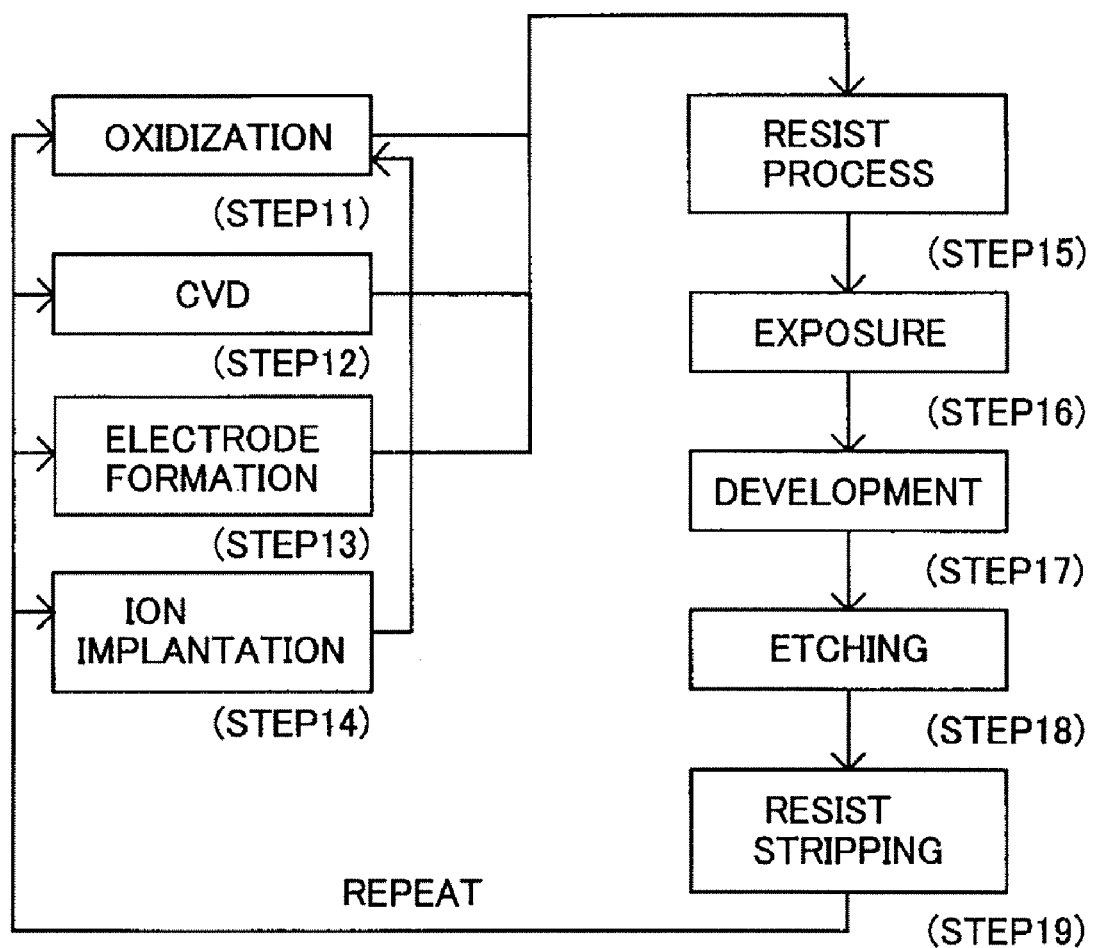
FIG. 17 is a detailed flowchart for Step 4 of wafer process shown in FIG. 16.

Referring now to FIGS. 16 and 17, a description will be given of an embodiment of a device manufacturing method using the above exposure apparatus 300. FIG. 16 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 17 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacturing method of this embodiment may manufacture a higher quality device than the conventional method. The device manufacturing method using the exposure apparatus 300, and resultant devices constitute one aspect of the present invention.

Further, the present invention is not limited to these preferred embodiments, and various variations and modifications may be made without departing from the scope of the present invention.

This application claims a foreign priority based on Japanese Patent Application No. 2005-203544, filed Jul. 12, 2005, which is hereby incorporated by reference herein.

What is claimed is:

1. A filter used for an exposure apparatus that exposes a plate using a light from a light source, said filter comprising:
   a light transmitting film configured to transmit the light from the light source;
   a first member that includes plural first rod members, and thermally contacts said light transmitting film, the plural first rod members being rod members; and
   a second member that includes plural second rod members, and thermally contacts at least one of said light transmitting film or said first member, the plural second rod members being other rod members,
   wherein the plural second rod members partition an area in which the light is illuminated in said light transmitting film into plural areas,
   wherein the plural first rod members are provided in each of the plural areas partitioned by the plural second rod members, and
   wherein a heating value transmittable by the first rod member per unit time in a longitudinal direction of the first rod member is smaller than a heating value transmittable by the second rod member per unit time in a longitudinal direction of the second rod member.

2. A filter according to claim 1, wherein the plural first rod members form a mesh structure.

3. A filter according to claim 2, wherein $s < \sqrt{(5 \times 10^4)} / \sqrt{(F \times Cp \times \rho / \lambda)}$ is met where F (Hz) is a frequency of the light source, Cp (J/kg/K) is a heat capacity of the light transmitting film, $\rho$ (kg/m$^3$) is a density of said light transmitting film, $\lambda$ (W/m/K) is a heat conductivity of said light transmitting film, s (m) is a size of a section defined by the mesh structure, and
   wherein when the section is a circle, the section defined by the mesh structure has a diameter of the circle, and when the section is a polygon, the section of the mesh structure has a diameter of a minimum circle that contacts at least three sides of the polygon.

4. A filter according to claim 3, wherein the light transmitting film is made of zirconium, and $s < 1 / \sqrt{(1000 \times F)}$ is met.

5. A filter according to claim 2, wherein $s > 0.3 \times th$ is met where th (m) is a thickness of the first rod member, and s (m) is a size of a section defined by the mesh structure, and
   wherein when the section is a circle, the section of the mesh structure has a diameter of the circle, and when the section is a polygon, the section of the mesh structure has a diameter of a minimum circle that contacts at least three sides of the polygon.

6. An exposure apparatus for exposing a mask pattern onto a plate using a light from a light source, said exposure apparatus comprising a filter according to claim 1 which is arranged in an optical path between the light source and the plate.

7. A device manufacturing method comprising the steps of:
exposing a plate to be exposed using an exposure apparatus; and
developing the exposed plate,
wherein said exposure apparatus exposes a mask pattern onto the plate using a light from a light source, and includes a filter according to claim 1 which is arranged in an optical path between the light source and the plate.

8. A light source unit for emitting a pulsed light, said light source unit comprising a filter according to claim 1.

9. A filter used for an exposure apparatus that exposes a plate using a light from a light source, said filter comprising:
a light transmitting film that has a first thickness, and is configured to transmit the light from the light source;
a first heat conductive member that has a second thickness larger than the first thickness, and thermally contacts said light transmitting film; and
a second heat conductive member that has a third thickness larger than the second thickness, and thermally contacts at least one of said light transmitting film or said first heat conductive member,
wherein said second heat conductive member partitions an area in which the light is illuminated in said light transmitting film into plural areas, and
wherein said first heat conductive member is arranged in each of the plural areas partitioned by said second heat conductive member.

10. An exposure apparatus for exposing a mask pattern onto a plate using a light from a light source, said exposure apparatus comprising a filter according to claim 1 which is arranged in an optical path between the light source and the plate.

11. A filter used for an exposure apparatus that exposes a plate using a light from a light source, said filter comprising:
a light transmitting film configured to transmit the light from the light source;
a first member that includes plural first rod members, and thermally contacts said light transmitting film, the plural first rod members being rod members;
a second member that includes plural second rod members, and thermally contacts at least one of said light transmitting film or said first member, the plural second rod members being other rod members;
a frame member that is provided along a circumference of said light transmitting film; and
a central member that is provided at a center of said light transmitting film,
wherein the plural first rod members are provided in one of an area enclosed by the plural second rod members, an area enclosed by the plural second rod members, and either said frame member or said central member, or an area enclosed by the plural second rod members, said frame member, and said central member, and
wherein a heating value transmittable by the first rod member per unit time in a longitudinal direction of the first rod member is smaller than a heating value transmittable by the second rod member per unit time in a longitudinal direction of the second rod member.

12. A filter used for an exposure apparatus that exposes a plate using a light from a light source, said filter comprising:
a light transmitting film configured to transmit the light from the light source;
a first member that includes plural first rod members, and thermally contacts said light transmitting film, the plural first rod members being rod members; and
a second member that includes plural second rod members, and thermally contacts at least one of said light transmitting film or said first member, the plural second rod members being other rod members,
wherein the plural first rod members are provided in an area defined by the plural second rod members, and
wherein a heating value transmittable by the first rod member per unit time in a longitudinal direction of the first rod member is smaller than a heating value transmittable by the second rod member per unit time in a longitudinal direction of the second rod member.

* * * * *